(12) United States Patent
Naito

(10) Patent No.: US 7,292,966 B2
(45) Date of Patent: Nov. 6, 2007

(54) METHOD OF SIMULATING DEFORMATION OF RUBBER MATERIAL

(75) Inventor: Masato Naito, Kobe (JP)

(73) Assignee: Sumitomo Rubber Industries, Ltd., Kobe-shi (JP)

( * ) Notice: Subject to any disclaimer, the term of this patent is extended or adjusted under 35 U.S.C. 154(b) by 52 days.

(21) Appl. No.: 11/227,518

(22) Filed: Sep. 16, 2005

(65) Prior Publication Data
US 2006/0106586 A1    May 18, 2006

(30) Foreign Application Priority Data
Nov. 15, 2004    (JP) .............................. 2004-330846

(51) Int. Cl.
*G06G 7/48*    (2006.01)
(52) U.S. Cl. .................... 703/6; 703/1; 703/2; 703/11; 703/12; 702/33; 702/41; 702/127; 702/182
(58) Field of Classification Search ..................... 703/6
See application file for complete search history.

(56) References Cited

OTHER PUBLICATIONS

Jorgen S. Bergstrom and Mary C. Boyce; "Mechanical Behavior of Particle Filled Elastomers"; Rubber Chemistry and Technology; ACS; Sep. 1999; pp. 633-656; ISSN: 0035-9475.*
P.P.A. Smit; "The Glass Transition in Carbon Black Reinforced Rubber"; Rheologica ACTA, Dietrick Steinkopff Verlag, Darmstadt, DE; vol. 5; Dec. 1966; pp. 277-283; ISSN: 0035-4511.*
Lizabeth A. Montalvo, A Study of the Mechanical Behavior of Particle Filled Elastomers, Massachusetts Institute of Technology, 1999.*
Guido Raos and Giuseppe Allegra, Mesoscopic bead-and-spring model of hard spherical particles in a rubber matrix. I. Hydrodynamic reinforcement, Journal of Chemical Physics, vol. 113 No. 17, Nov. 200, pp. 7554-7563.*
Arruda et al., J. Mech. Phys. Solids, vol. 41, No. 2, 1993, pp. 389-412.
Bergstrom et al., J. Mech Phys. Solids, vol. 46, No. 5, 1998, pp. 931-954.
Bergstrom et. al., "Mechanical Behavior of Particle Filled Elastomers" Rubber Chemistry and Technology, pp. 633-656 (1999).
Bergstrom et al., Mechanics of Material, vol. 33, pp. 523-530 (2001).
Dommelen et al., Coputational Materials Science, vol. 27, pp. 480-492 (2003).
Smit et al. "The Glass Transition in Carbon Black Reinforced Rubber" vol. 5, pp. 277-283 (1966).

* cited by examiner

*Primary Examiner*—Paul Rodriguez
*Assistant Examiner*—Jonathan Teets
(74) *Attorney, Agent, or Firm*—Birch, Stewart, Kolasch & Birch, LLP

(57) ABSTRACT

A method of simulating deformation of a rubber material with a filler part made of one filler particle and a rubber part surrounding the filler pan, comprises the steps of: dividing the rubber material into a finite number of elements to form a rubber material model; performing deformation calculation of the rubber material model based on a predetermined condition; and acquiring necessary data from the deformation calculation; wherein the step of dividing includes the steps of: dividing the filler part into a finite number of elements to form a filler model; and dividing the rubber part into a finite number of elements to form a rubber model disposed around the filler model, the rubber model having strain-rate dependence such that the viscoelastic property varies with strain rate thereof.

7 Claims, 19 Drawing Sheets

Fracture of linking point

Stress distribution chart

Deformation frequency $10^6$ Hz

Energy loss distribution chart
Deformation frequency $10^6$ Hz (A) Stress@10Hz (B) Stress@10⁶Hz

METHOD OF SIMULATING DEFORMATION OF RUBBER MATERIAL

BACKGROUND OF THE INVENTION

1. Field of the Invention

The present invention relates to a method of simulating deformation of a rubber material which comprises: a filler part made of at least one filler particle; and a rubber part made of rubber and surrounding the filler part, with good accuracy.

2. Description of the Related Art

The rubber material is widely used in for example, tires and industrial goods such as sporting goods. To reduce the trouble and the cost of experimental manufacture, a simulation of for example, deformation process of the rubber material is carried out using a computer. The conventional simulation methods of the rubber material are described in for example, the following articles.

(1) "A THREE-DIMENSIONAL CONSTITUTIVE MODEL FOR THE LARGE STRETCH BEHAVIOR OF RUBBER ELASTIC MATERIALS" by Ellen M. Arruda and Marry C. Boyce, Journal of the Mechanics and Physics of Solids Volume 41, Issue 2, Pages 389-412 (February 1993).

(2) "CONSTITUTIVE MODELING OF THE LARGE STRAIN TIME-DEPENDENT BEHAVIOR OF ELASTOMERS" by J. S. BERGSTROM and M. C. BOYCE, Journal of the Mechanics and Physics of Solids Volume 46, No.5 PP. 931-954 (1998)

The article (1) describes a method for analyzing a rubber material using a molecular chain network model theory. According to the method described in this article, however, strain-rate dependence of general rubber material can not be replicated.

The strain-rate dependence is a characteristic of a rubber material showing different viscoelasticity characteristics depending upon its strain rate. That is, when amplitude strains of different frequencies (e.g., 10 Hz and 1,000 Hz) are applied to the same rubber test pieces, energy losses of the respective frequencies have different values. In the article (1), such the strain-rate dependence is not taken into consideration. Thus, material characteristics of different frequencies can not be evaluated precisely from one rubber material model.

Here, a pneumatic tire is used as an example of a rubber product, and two performances, i.e., its fuel efficiency and grip performance (index of stick of the tire with respect to a road surface at the time of acceleration and/or deceleration) will be considered. First, in order to enhance the fuel efficiency of the tire, it is effective to use a rubber having small energy loss for a tread rubber when a vehicle runs at general steady running speed. That is, when the fuel efficiency is to be evaluated, it is necessary to check the energy loss of rubber at a low strain rate of about from 10 to 100 Hz at frequency.

On the other hand, in order to enhance the grip performance, it is necessary to use a deformable rubber for a tread rubber such that the rubber fits to fine projections and depressions on a road surface at the instant when the rubber comes into contact with the road surface. For this purpose, in order to enhance the grip performance, it is desirable that the rubber has high energy loss at the time of high speed deformation. When evaluating the grip performance, it is necessary to check the energy loss of rubber at high strain rate of about from 10,000 to 1,000,000 Hz at frequency.

FIG. 21 is a graph showing a relationship between the frequency of strain rate and the energy loss calculated using frequency-temperature conversion rule with respect to a tire rubber material, and the relationship is shown with solid line. As apparent from the drawing, if frequency is varied, the energy loss is also largely varied. According to the method of the article (1), however, even if the strain rate of the rubber model is changed, only the same energy loss is obtained as shown with chain double-dashed line. With this, data useful for developing rubber can not be obtained. The strain rate is a product of deformation frequency and strain.

The article (2) describes that a rubber model is set from rubber material in which a filler is mixed, and the strain-rate dependence is taken into consideration. When deformation of the rubber material is calculated, the handling of an interface between the filler and rubber is important problem. As a result of various researches, it was found that in the interface, relatively high energy loss was generated due to slip or friction between the rubber and filler. Therefore, in order to carry out a precise simulation of rubber material, it is important to model the filler and the rubber separately.

According to the technique described in the article (2), however, the filler and the rubber are modeled collectively not separately. With such a method, it is not impossible to obtain information such as a state of interface between rubber and filler and a distribution state of stress at the time of deformation.

SUMMARY OF THE INVENTION

It is a main object of the present invention to provide a method capable of carrying out a simulation concerning a deformation state or the like of a rubber material precisely by including a state of interface between the filler and rubber.

In accordance with the present invention, a method of simulating deformation of a rubber material having a filler part made of at least one filler particle and a rubber part surrounding the filler part, comprises the steps of:

dividing the rubber material into a finite number of elements to form a rubber material model;

performing deformation calculation of the rubber material model based on a predetermined condition; and acquiring necessary data from the deformation calculation; wherein said step of dividing includes the steps of:

dividing the filler part into a finite number of elements to form a filler model; and dividing the rubber part into a finite number of elements to form a rubber model disposed around the filler model, said rubber model having strain-rate dependence that the viscoelastic property varies with strain rate thereof.

According to the simulation method of the present invention, the rubber material model used for the deformation calculation includes a filler model and a rubber model surrounding the filler model. Therefore, it is possible to know a distribution of physical value (e.g., stress and energy loss) around the filler. Therefore, more detail and more concrete analysis can be carried out. Such physical values data are visualized as a distribution chart, and this becomes useful information for developing rubber and/or filler materials.

Further, according to the simulation method of the present invention, strain-rate dependence is defined in the rubber model. There exists a physical tester which applies periodic strain to a rubber and measures viscoelasticity thereof.

However, the current measuring technique, the frequency of strain is as low as about 1,000 Hz. This is not sufficient to evaluate the grip performance of rubber products such as a tread rubber. If the strain-rate dependence is applied to the rubber model, viscoelasticity of high dimension which can not be obtained by the tester can be estimated.

It is preferable that the rubber model includes an interface model and a matrix model. A filler-mixed rubber has a physical interface between the filler and rubber. When the filler is carbon black, the interface is a physical coupling. When the filler is silica, the interface is a chemical coupling by means of a coupling agent. These couplings will be replicated in a pseudo manner relatively precisely by adjusting the viscoelasticity characteristics of rubber of the interface model. Therefore, it is possible to sufficiently study and evaluate the coupling agent.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
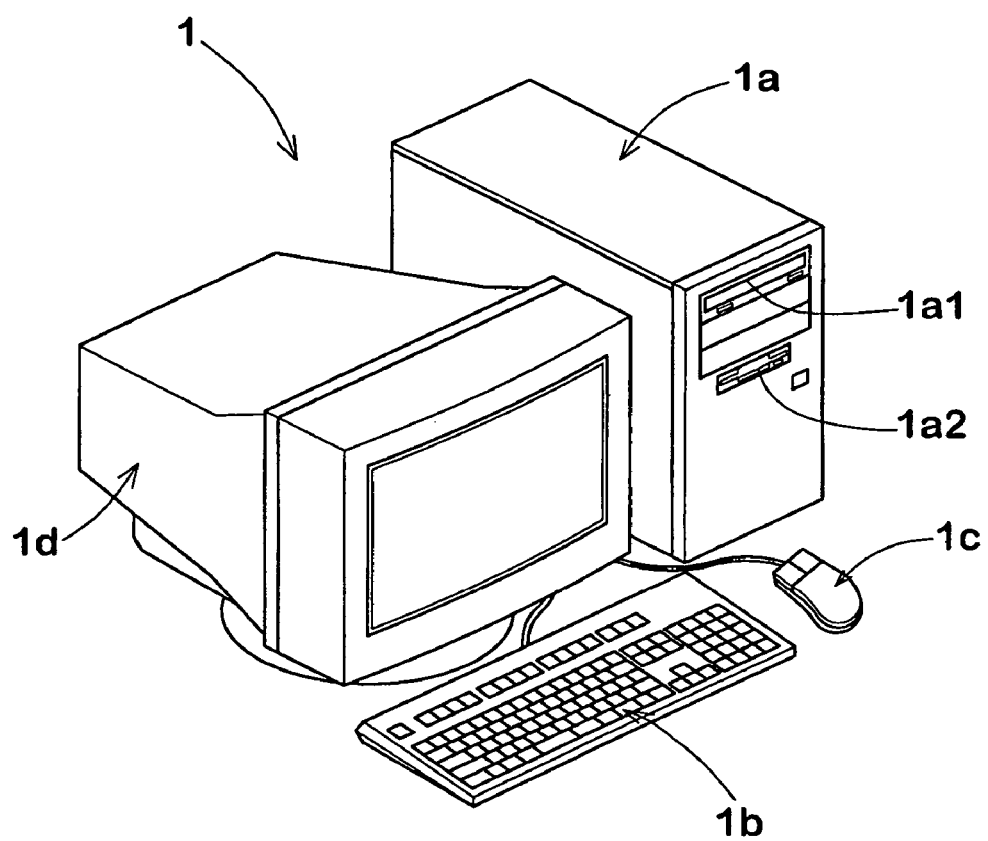
FIG. 1 is a perspective view showing one example of a computer apparatus used in the present invention.

A description will be given below of preferred embodiments according to the present invention with reference to the attached drawings. FIG. 1 shows a computer apparatus 1 for carrying out a simulation method according to the present invention. The computer apparatus 1 includes a main unit 1a, a keyboard 1b, and a mouse 1c serving as input means, and a display 1d serving as output means. Although not shown, the main unit 1a is appropriately provided with a central processing unit (abbreviated as "a CPU"), a ROM, a working memory, a large-capacity storage device such as a magnetic disk, and drives 1a1 and 1a2 for a CD-ROM or a flexible disk. The large-capacity storage device stores therein processing procedures (i.e., programs) for executing a method, described later.

Figure 2:
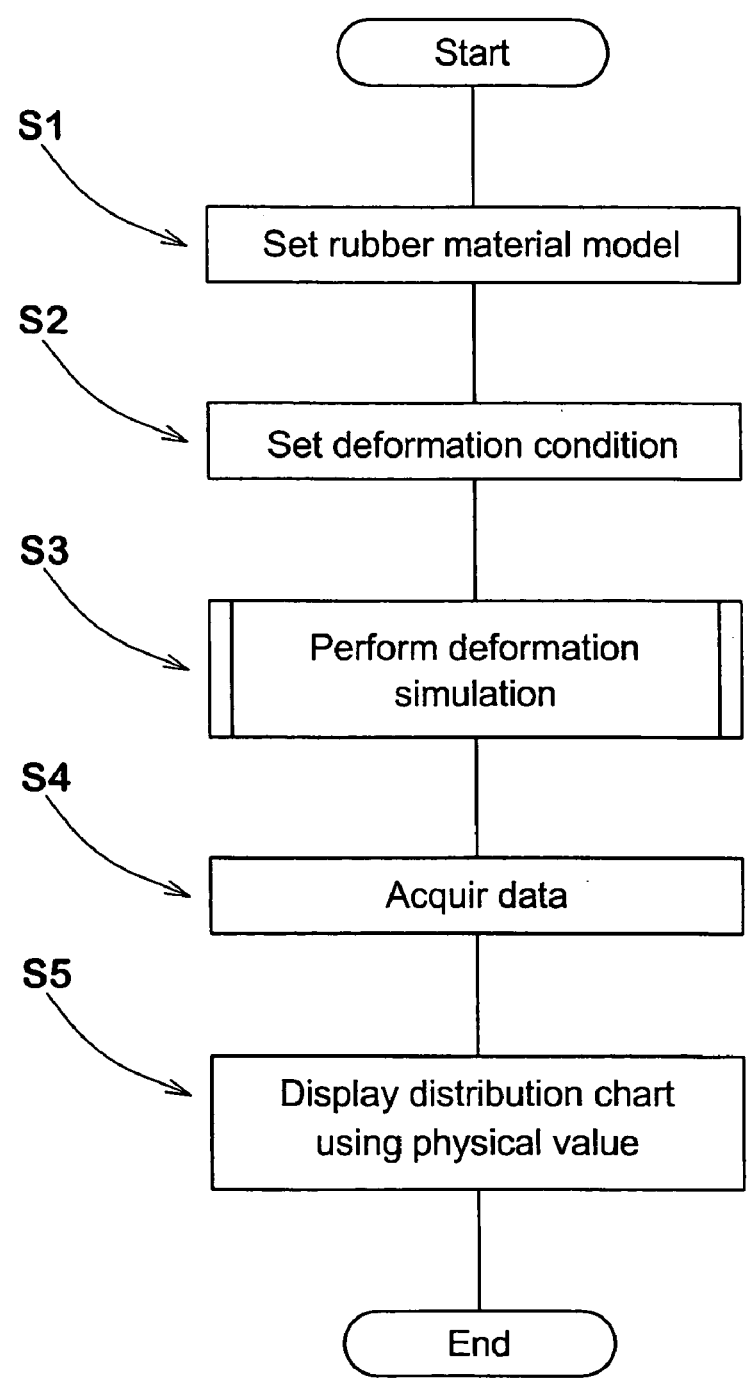
FIG. 2 is a flowchart showing procedures according to a preferred embodiment of the present invention.
Figure 3:
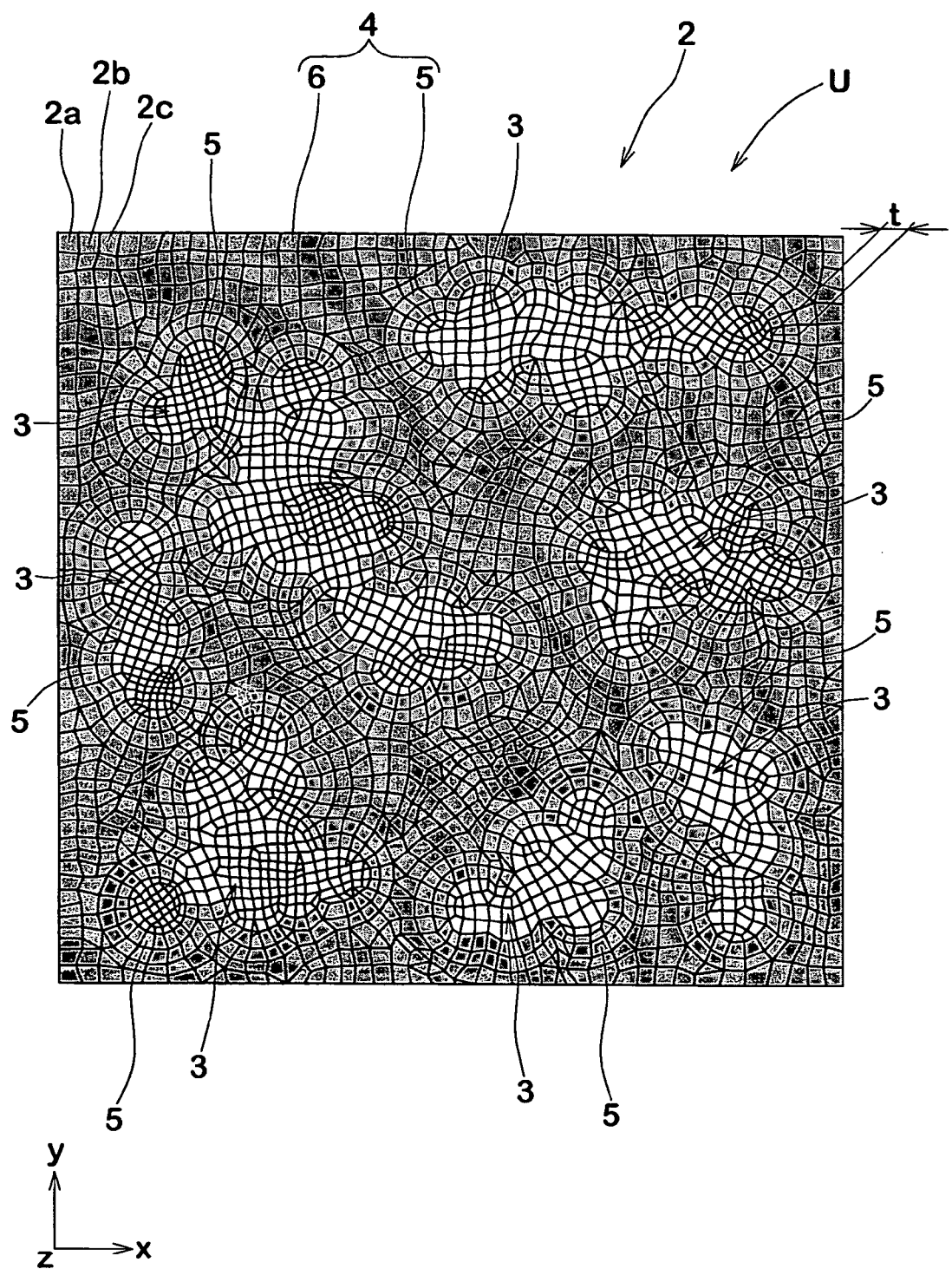
FIG. 3 is a diagram showing one preferred embodiment of a rubber material model (microscopic structure)

FIG. 2 shows one example of a processing procedure of the simulation method according to the present invention. In the present embodiment, a rubber material model is first set (step S1). In FIG. 3, one example of the rubber material model 2 serving as a microscopic structure (It may be also called "unit cell".) is visually shown.

To form the rubber material model 2, a microscopic region of the rubber material comprising a filler part made of at least one filler particle and a rubber part surrounding the filler part (no object on whether existent or not) to be analyzed is divided into a finite number of small elements 2a, 2b, 2c . . . . A parameter necessary for deformation calculation using a numerical analysis method is given to each element 2a, 2b, 2c . . . . The numerical analysis method includes for example, finite element method, finite volume method, calculus of finite differences, or boundary element method.

The parameter includes for example, node coordinate value, element shape, and/or material property of each element 2a, 2b, 2c . . . . Further, a triangular or a quadrilateral element serving as for example, a two-dimensional plane and a tetrahedral or a hexagonal element serving as a three-dimensional element is used for each element 2a, 2b, 2c . . . . Thus, the rubber material model 2 is numerical data utilizable in the computer apparatus 1. In this example, the two-dimensional rubber material model 2 is shown.

The rubber material model 2 of this present embodiment is analyzed in a plane distorted state in a later-described deformation simulation. Therefore, the rubber material model 2 does not have a strain in the Z direction (direction perpendicular to the sheet of the drawing). Vertical and horizontal sizes of the rubber material model 2 of this embodiment are set to be 300×300 nanometers.

The rubber material model 2 comprises at least one filler model 3 in which the filler part is modeled into a finite number of elements, and a rubber model 4 in which the rubber part is modeled into a finite number of elements disposed around the filler model. In this preferred embodiment, the rubber model 4 comprises at least one interface model 5 contacting around the filler model 3, and a matrix model 6 disposed outside the interface model. In other words, the interface model 5 is filling with a space between the filler model 3 and the matrix model 6. In the FIG. 3, the filler model 3 is illustrated as a white part, the matrix model 6 is illustrated as the darkest part, and the interface model 5 is illustrated as a little thin gray part.

Figure 4:
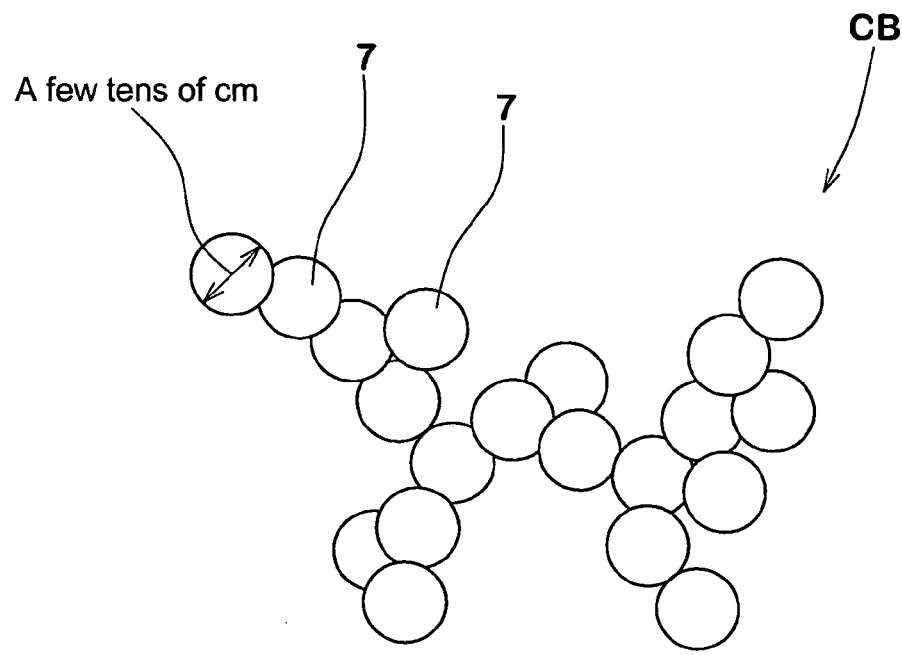
FIG. 4 is a diagram showing a shape of a carbon black.

In this present embodiment, the filler model 3 in which a carbon black is modeled is shown. It is to be noted that the filler is not limited to carbon black and may be for example, silica and the like. In the present example, the physical shape of the filler model 3 is set based on the shape of the carbon black particles filled in the actual rubber imaged with an electronic microscope. FIG. 4 shows a secondary particle CB of the carbon black. The secondary particle CB has, more specifically, a structure in which a plurality of spherical primary particles 7 each consisting of carbon atom having a diameter of approximately 10 nm is irregularly bonded three-dimensionally. The filler model 3 of this embodiment is set to the standard in the plane shape of above secondary particle CB of the carbon black.

The carbon black has hardness (modulus of longitudinal elasticity) several hundred times harder than the matrix rubber. Thus, the filler model 3 is defined as an elastic body with a modulus of longitudinal elasticity as the material property, and the stress and the strain are proportional in the deformation calculation so as to not produce energy loss in the present embodiment. The number of filler model 3 in a cell unit is appropriately set based on the filler blending amount of the rubber material of the analyzing object.

The interface model 5 is not necessarily limited to continuously surround the filler model 3, but preferably, surrounds the filler model 3 throughout the entire range. In this example, the interface model 5 has a small thickness. The thickness t of the interface model 5 is preferably set in a range of from 1 to 20 nm, and more preferably from 5 to 10 nm.

The matrix model 6 comprises a finite number of triangular and/or quadrilateral elements, and constitutes a main part of the rubber material model 2 in a unit cell U.

Figure 5:
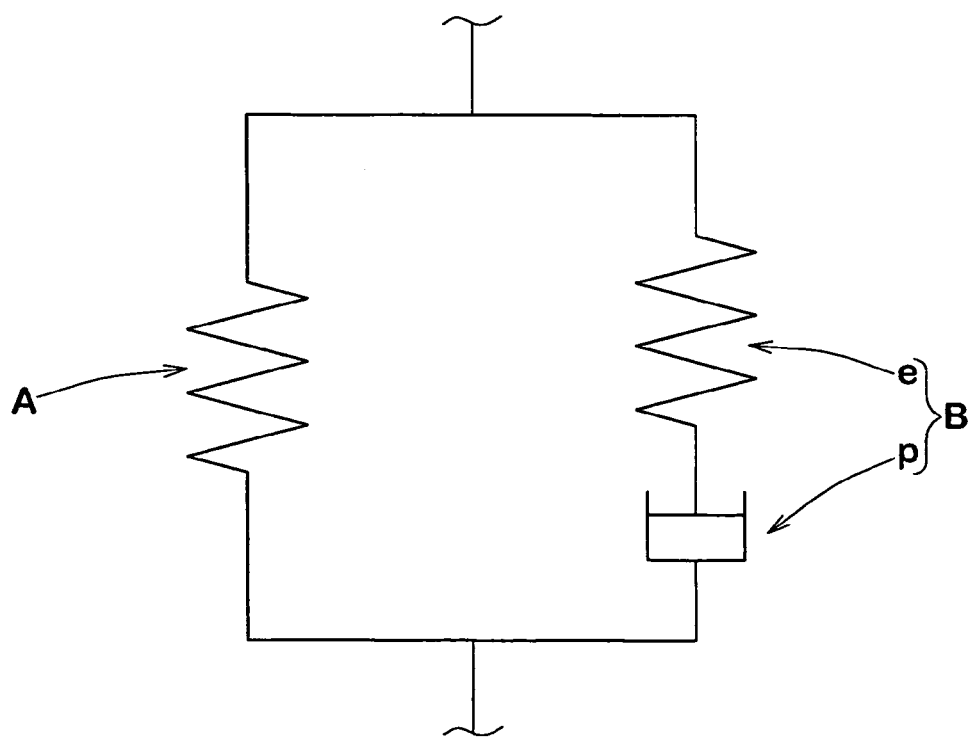
FIG. 5 is a diagram explaining deformation of a rubber model.

In the present invention, a strain-rate dependence in which stress generated in accordance with strain rate is varied is defined in the rubber model 4. FIG. 5 is a conception diagram used for explaining a deformation principle of the rubber model 4 with the strain-rate dependence. Each element of the rubber model 4 is expressed as a model in which a first deformation network "A" and a second deformation network B are coupled to each other in parallel. A stress S generated in the entire system is a sum of a stress generated in the first deformation network "A" and a stress generated in the second deformation network B. Since the networks A and B are coupled to each other in parallel, strains (extensions) generated in the networks A and B are the same.

The first deformation network A is expressed as one which is equivalent to a coil spring. The stress generated in the first deformation network "A" assumes a value which is in proportion to the extension (strain) of the spring. Further, the extension of the spring generates only based on a load. Therefore, the stress which does not depend on the strain rate is generated in the first deformation network "A".

The second deformation network B is expressed as a model that a coil spring e and a dashpot p are connected to each other in series. The dashpot p is a damping apparatus comprising a cylinder sealing fluid therein, and a piston with an orifice which moves in the cylinder. The fluid is pursuant to Newton's viscosity rule, and is oil for example. Resistance which is proportional to moving speed of the piston is generated in the dashpot e. The extension (strain) of the entire second deformation network B is equal to a sum of extensions of the spring e and dashpot p. Stress generated in the second deformation network B is equal to a value corresponding to the extension (strain) of the spring e. However, the extension of the spring e is not simply determined in accordance with a load, and the extension is influenced by resistance of the dashpot p which depends on its strain rate. That is, the second deformation network B produces stress which depends on the strain rate.

Next, stress calculating procedure based on the deformation networks "A" and B will be explained.

First Deformation Network A:

For calculating the stress of the first deformation network "A", an eight chains rubber elasticity model based on a molecular chain network model theory is used. Stress shown in the following equation (1) is applied in speed type.

$$\overset{\triangledown}{S}_{ij} = -p\delta_{ij} + \frac{1}{3}C^R\sqrt{N}\left\{\left(\frac{\zeta}{\sqrt{N}} - \frac{\beta}{\lambda_c}\right)\frac{A_{ij}A_{kl}}{A_{mm}} + \frac{\beta}{\lambda_c}(\delta_{ik}A_{jl} + A_{ik}\delta_{jl})\right\}\dot{\varepsilon}_{kl} \quad (1)$$

where
$C^R = n \cdot k_B \cdot T$
n: number of molecular chains per unit volume;
$k_B$: Boltzmann constant;
T: absolute temperature;
N: average segment number per one molecular chain;
$A_{ij}$: left Cauchy-Green deformation tensor;

$$\lambda_c^2 = \frac{1}{3}(\lambda_1^2 + \lambda_2^2 + \lambda_3^2);$$

$\lambda_1^2, \lambda_2^2, \lambda_3^2$; elongation ratios at each direction;

$$\beta = L^{-1}\left(\frac{\lambda_c}{\sqrt{N}}\right);$$

L(X): Langevin function;

$$\zeta = \frac{\beta^2}{1 - \beta_c^2 \csc h^2 \beta}; \text{ and } \dot{p} = 100;.$$

Figure 6:
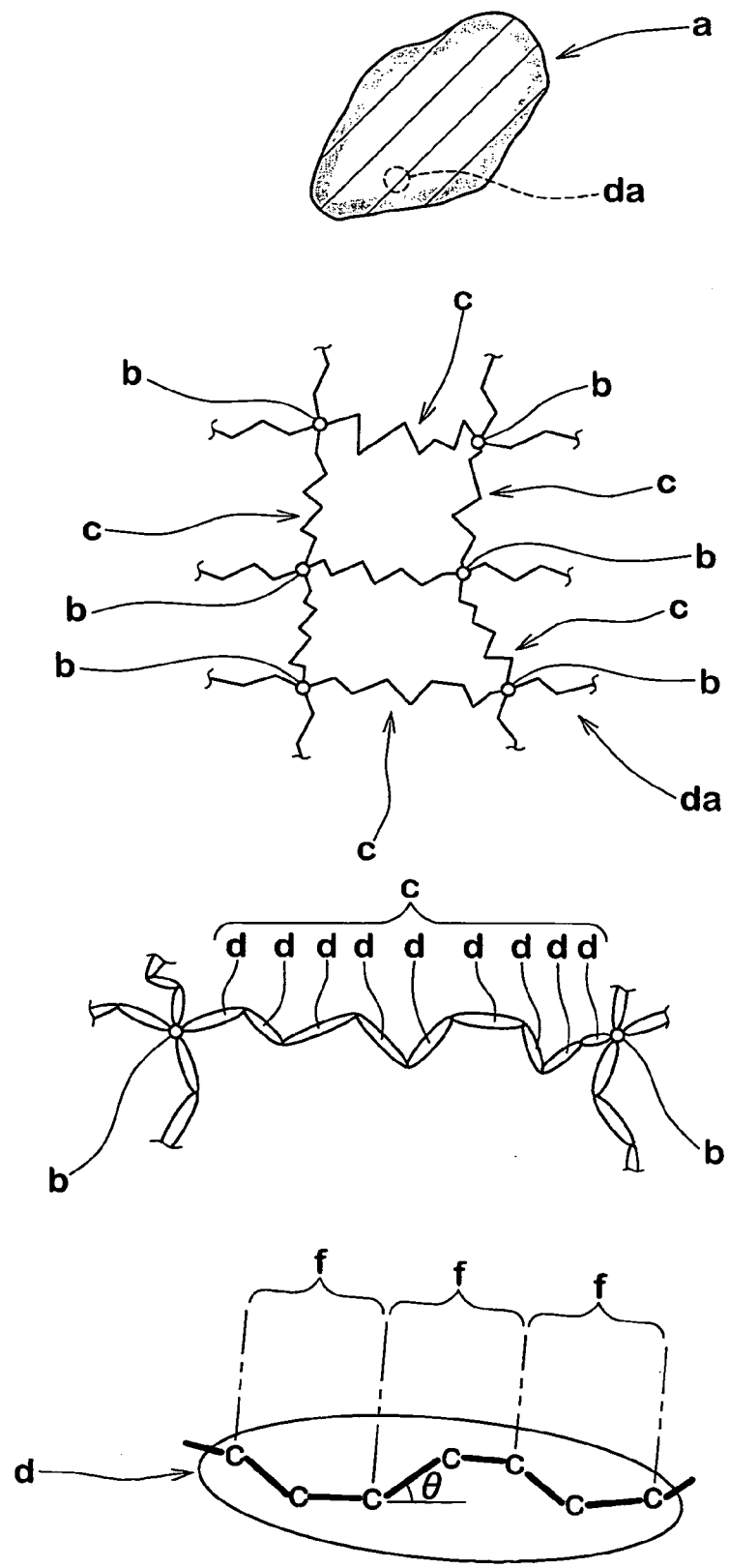
FIG. 6 is an enlarged view of the rubber material, one structure of molecular chain thereof, an enlarged molecular chain, and an enlarged segment.

AS shown in FIG. 6, the above mentioned molecular chain network model theory depends that the rubber material "a" has a network structure as a microscopic structure "da". The network structure of the rubber material includes a plurality of molecular chains c linked at a linking point b and arranged disorderly. The linking point b includes a chemical linking point between the molecules such as for example, a chemical cross-linking point.

One molecular chain c comprises a plurality of segments d. One segment d is the smallest constitutional unit for repetition in the above mentioned theory. Further, one segment d is configured by joining a plurality of monomers f in which carbon atoms are linked by covalent bonding. Carbon atoms each freely rotates with respect to each other around a bond axis between the carbons. Thus, the segment d can be bent, as a whole, into various shapes.

In the above mentioned theory, with respect to the fluctuation cycle of the atom, the average position of the linking point b does not change in the long term. Therefore, the perturbation about the linking point b is ignored. Further, the end-to-end vector of the molecular chain c having two linking points b, b on both ends is assumed to deform with a continuous body of the rubber material "a" to which the molecular chain is embedded.

Figure 7:
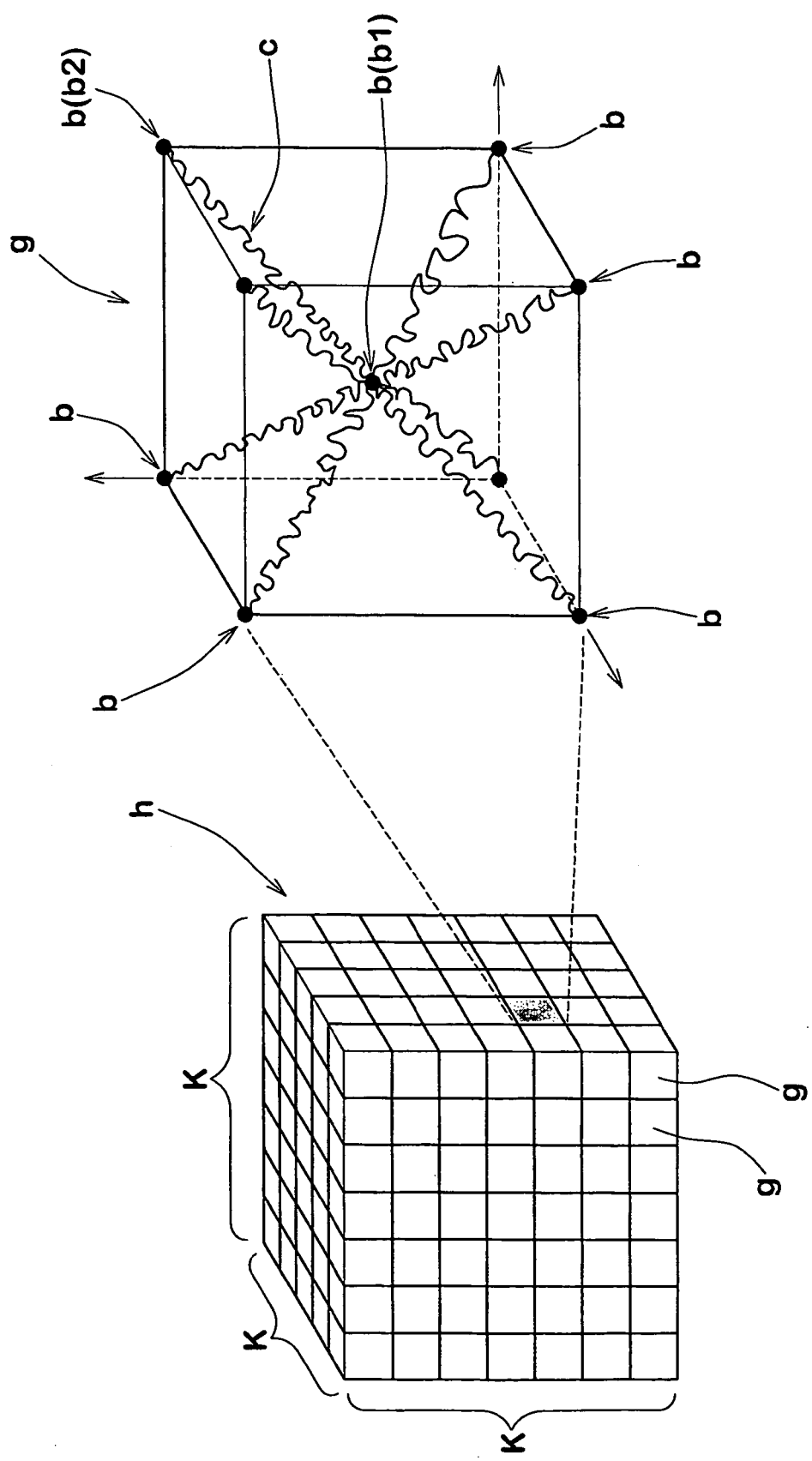
FIG. 7 is a perspective view showing one example of a network structure of the rubber material and an enlarged view of a eight chain rubber material model thereof.

AS shown in FIG. 7, this theory also depends that the macroscopic structure of the rubber material comprises a cubic network structure body h in which the microscopic eight chain rubber elasticity models g are collected. In one eight chain rubber elasticity model g, the molecular chain c extends from one linking point b1 placed at the center of the cube to each of the eight linking point b2 at each apex of the cube, as shown enlarged on the right side of FIG. 7. By using these models, stress generated in the rubber material "a" is calculated.

In order to perform a simulation with good accuracy, in the first deformation network "A", a general eight chains rubber elasticity model proposed in the article (1) is modified in the following manner and used.

Figure 8:
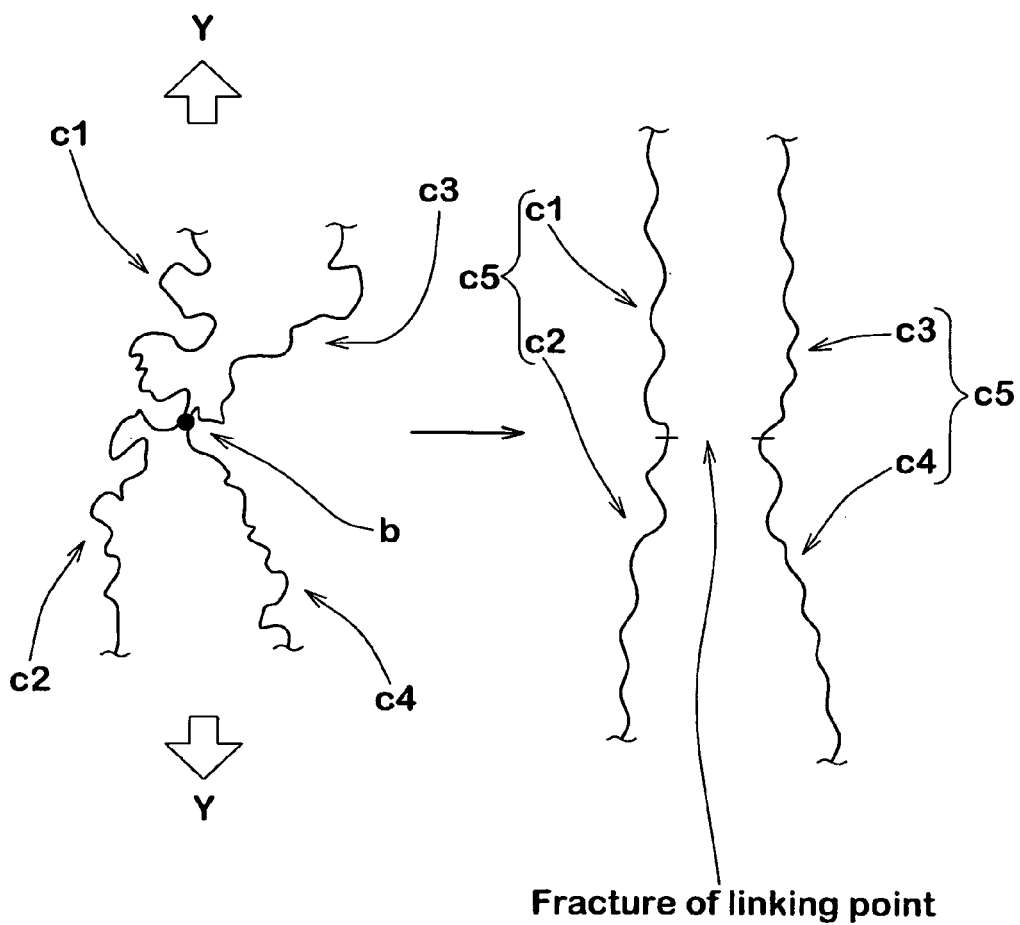
FIG. 8 is a diagram explaining the break of a linking point of a molecular chain.

The rubber material tolerates great strain reaching to several hundred % by stretching. The inventor et al. hypothesized that the great strain of the rubber material is produced when the debt portion such as the linking point b of the molecule chain c which became entangled intricately comes loose. That is, as shown in FIG. 8, when tensile stress shown as arrows Y is loaded to the molecular chains c1, c2, c3 and c4 linked at one linking point b, each molecular chain c1 to c4 stretch and the linking point b is subjected to great strain and tends to break (disappear). As shown on the right side of FIG. 8, the two molecular chains c1 and c2 act as one long molecular chain c5. The molecular chains c3 and c4 also act in the same way. In this method of this present embodiment, in order to obtain an exact result, the reduction of the linking point b of such a molecule chain c is taken into consideration in the equation (1) as follows.

Here, the network structure body h as shown in FIG. 7 is a body in which k number of eight chain rubber elasticity model are each bonded in the directions of the axis, the height, and the depth. It is to be noted that k is a sufficiently big number. The total number of linking point b included in the relevant network structure body h is referred to as "binding number". Assuming that the binding number is "m" and the number of molecular chains c in the network structure h (i.e., the number of molecular chains per unit volume of the matrix model 3) is "n", m and n are expressed as following equations (2) and (3), respectively.

$$m=(k+1)^3+k^3 \quad (2)$$

$$n=8k^3 \quad (3)$$

Since "k" is a sufficiently big number, when the terms other than the third power of k are omitted, the above equations may be expressed as the following equations (4) and (5), respectively:

$$m=2k^3 \quad (4)$$

$$n=4m \quad (5)$$

Further, since the total number $N_A$ of segments of the molecular chain included in the rubber model 4 does not change even if the rubber model 4 is deformed, equations (6), (7) and (8) are realized.

$$N_A=n \cdot N \quad (6)$$

$$N=N_A/n \quad (7)$$

$$N=N_A/4m \quad (8)$$

As apparent from the equation (8), when the binding number m of the molecular chain of the rubber reduce by loaded deformation thereof, the average segment number N in one molecular chain has to increase. In other words, by having the average segment number N as a variable parameter having different values according to the deformation, the reduction of the binding number m of the molecular chain by stretch can be expressed in the simulation. This can simulate the deformation mechanism of rubber with more sufficient accuracy, and is useful for improvement in calculation accuracy. Here, the loaded deformation is deformation in which distortion of rubber model 4 increases between minute time.

The average segment number N is determined by various methods. For instance, the average segment number N can be increased based on the parameter related to strain during the loaded deformation. The parameter related to strain is not particularly limited and may be for example, strain, strain rate, or primary invariable quantity $I_1$ of strain. In the present embodiment, the average segment number N is defined by the following equation (9). This equation shows that the average segment number N is a function of the primary invariable quantity $I_1$ (more specifically, a parameter $\lambda_c$ square root thereof) of strain in each element of the relevant rubber model 4.

$$N(\lambda_c)=A+B \cdot \lambda_c+C \cdot \lambda_c^2+D \cdot \lambda_c^3+E \cdot \lambda_c^4 \quad (9)$$

Equation (9) is one example established by a variety of experiments, and the constants A to E may be easily set based on for example, a uniaxial tension test result of the rubber material. For instance, the stress-strain curve is first obtained for the rubber material or the object to be analyzed. Subsequently, parameters n and N are set so as to be along the curve of when load is unloaded. The total number $N_A$ (=n·N) of segment of the molecular chain is thus determined. Here, since the total segment number $N_A$ of the molecular chain c is the same during the loaded deformation and during the unloaded deformation, the average segment number N in each strain is derived so as to comply with the curve during when load is loaded. The parameters A to E of equation (9) are determined so as to comply with the determined average segment number N during loading. In the present embodiment, N=16 is used, and as for the value of N during unloaded deformation, the value at the time of the end of load is adopted. The above constants are set as:

A=+2.9493

B=−5.8029

C=+5.5220

D=−1.3582

E=+0.1325.

Figure 9:
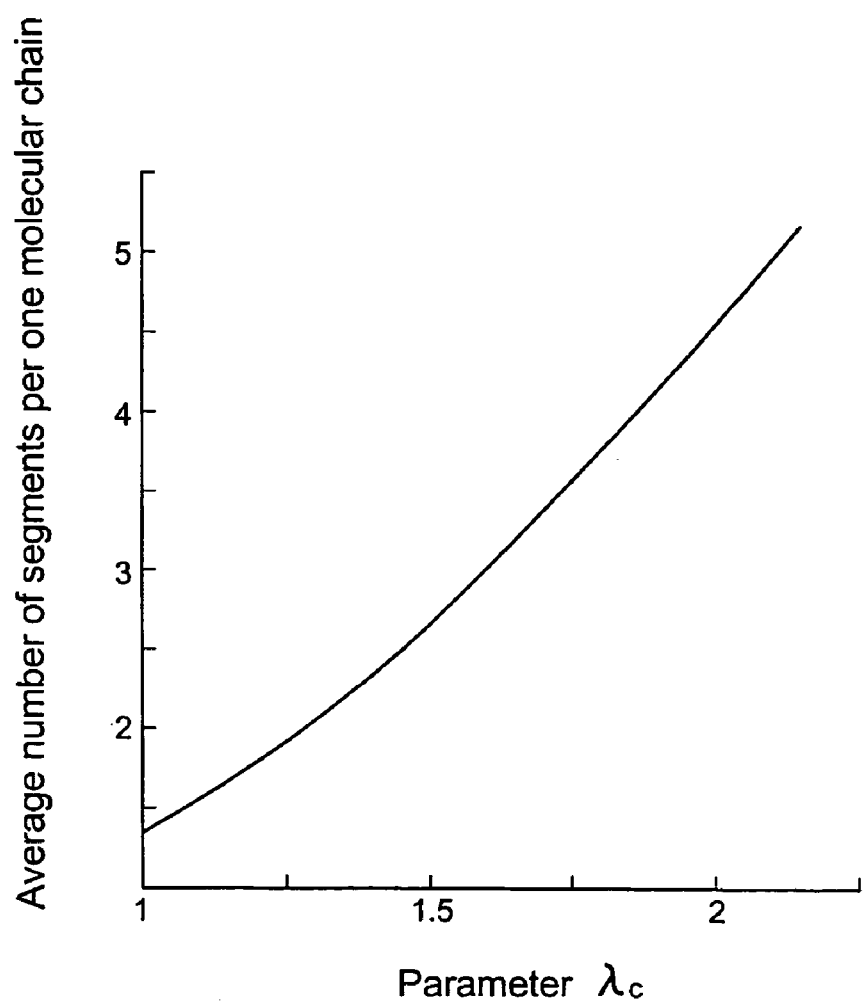
FIG. 9 is a graph showing a relationship of a parameter λc and an average segment number N per one molecular chain.

In FIG. 9, a relationship between the average segment number N and the parameter $\lambda_c$ during loaded deformation of each element of the rubber model 4 is shown. When $\lambda_c$, a parameter relating to strain, is increased, the average segment number N is also gradually increased. In this example, the upper limit of parameter $\lambda_c$ is 2.5. In the deformation simulation of the rubber material model 2 described hereinafter, during the loaded deformation, the parameter $\lambda_c$ of each element of the rubber model 4 is calculated on a steady basis. The calculated $\lambda_c$ is substituted to equation (9), and the average segment number N during the relevant strain state of the relevant element is calculated. Here, the value of the average segment number N is held during unloaded deformation of the rubber model 4 in which load is reducing in a minute time.

Second Deformation Network B:

The eight chains rubber elasticity model based on the molecular chain network model theory is also applied to the spring e of the second deformation network B. Therefore, stress generated in the second deformation network B is also calculated using the above mentioned equation (1). However, resistance depending upon strain rate is generated in the second deformation network B, and this exerts influence on extension ratio $\lambda_c$.

The extension ratio $\lambda_c$ is calculated from a main stretch of each direction of the molecular chain as described in proviso in the equation (1). In the second deformation network B, each main stretch $\lambda_i^{(Be)}$ is calculated in accordance with the following procedure. Here, a subscript "i" represents each direction (i=1, 2, . . . ), and if it is two dimension, the subscript i represents x and y. A right shoulder subscript "Be" is a symbol used for distinguishing from the main stretch of the first deformation network A.

First, corresponding shearing stress $\tau^{(B)}$ in the second deformation network B is calculated in the equation (10). In the equation (10), $\sigma^{(B)'}$ is a corresponding stress of the second deformation network B obtained by the calculation of the previous step. Further, a strain rate of the dashpot p is calculated from the equation (11) by using value of corresponding shearing stress $\tau_{(B)}$ and $\lambda_c^{(Bp)}$. The $\lambda_c^{(Bp)}$ in the equation (11) is an extension ratio of the dashpot p. This value is calculated based on the method of proviso of the equation (1) from the last calculated value $\lambda_i^{(Bp)}$ (calculated in the later-described equation (14)).

$$\tau^{(B)} = \sqrt{\frac{1}{2}(\sigma^{(B)'} \cdot \sigma^{(B)'})} \quad (10)$$

$$\dot{\gamma}^{(Bp)} = \hat{c}_1 [\lambda_c^{(Bp)} - 1]^{c2} \cdot \tau^{(B)m} \quad (11)$$

where the parameters c1 and c2 each are constant defined according to a rubber material.

A strain rate $D^{(Bp)}$ of the dashpot p is calculated from the following equation (12) from the strain rate. The extension of the dashpot p is calculated by the following equations (13) and (14) from the strain rate $D^{(Bp)}$. Here, the subscript t represents a time step of calculation, and $\Delta t$ represents increment thereof.

$$D^{(Bp)} = \dot{\gamma}^{(Bp)} \cdot \frac{1}{\sqrt{2}\,\tau^{(B)}} \sigma^{(B)'} \quad (12)$$

$$\dot{\lambda}_i^{(Bp)}\big|_{t=t+\Delta t} = \lambda_c^{(Bp)}\big|_{t=t} \cdot D_i^{(Bp)} \quad (13)$$

$$\lambda_i^{(Bp)} = \int \dot{\lambda}_i^{(Bp)} dt \quad (14)$$

Each stretch $\lambda_i^{(Be)}$ of the spring e of the second deformation network B is calculated from the following equation (15). In the equation (15), $\lambda_i$ represents extension ratio of the entire second deformation network B.

$$\lambda_i^{(Be)} = \lambda_i / \lambda_i^{(Bp)} \quad (15)$$

The stress of the second deformation network B is calculated by substituting the $\lambda_i^{(Be)}$ into the equation (1). By adding the stress of the first deformation network A and the stress of the second deformation network B to each other, the entire stress of the rubber model 4 is calculated. This stress depends on the strain rate. This dependence is adjusted based on each material constants c1 and c2 in the equation (11).

It is preferable that the strain rate dependence is defined by at least one of, preferably both of the interface model 5 and the matrix model 6. In this embodiment, the strain-rate dependence is defined by both the interface model 5 and the matrix model 6.

Figure 10:
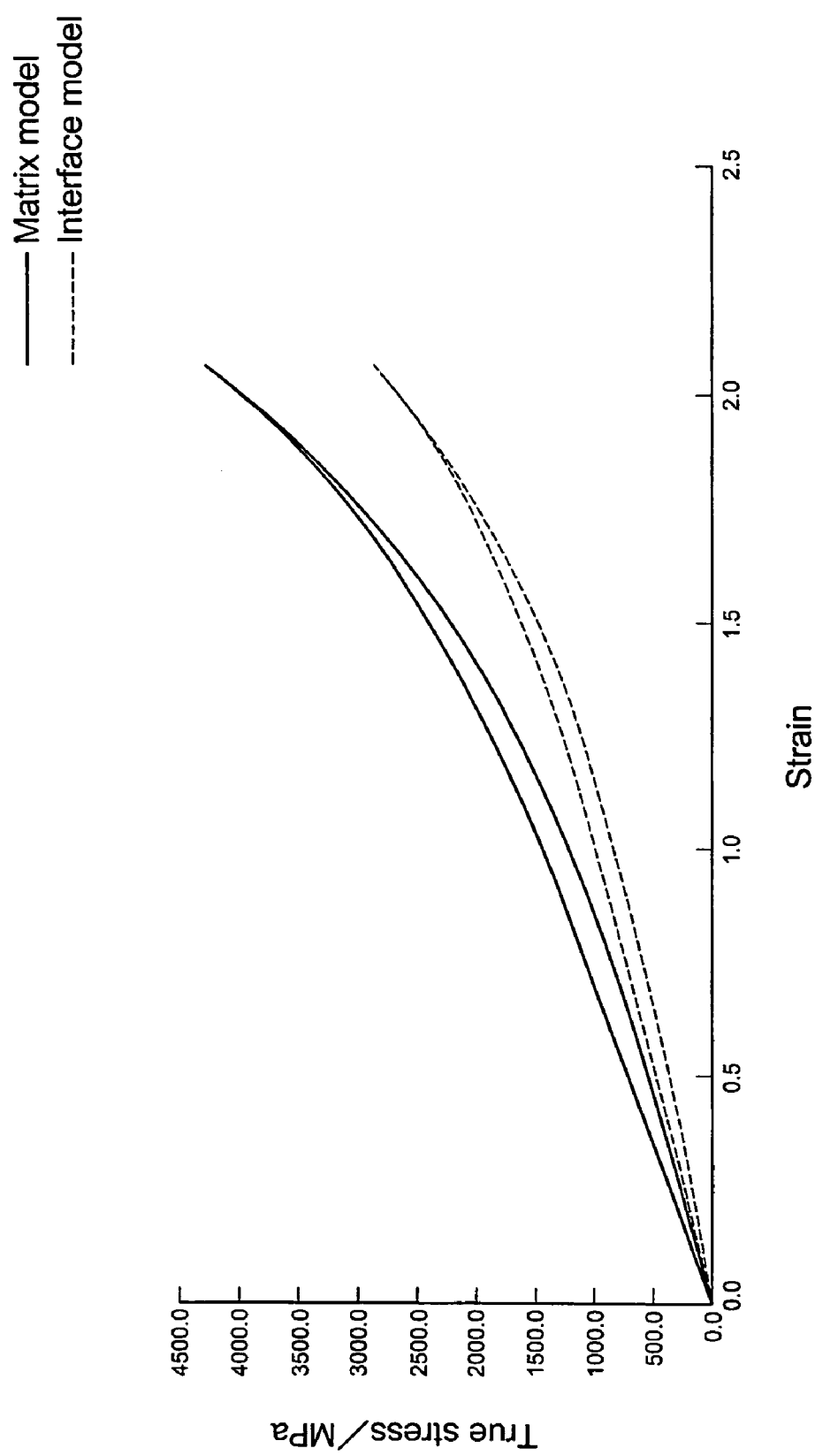
FIG. 10 is a graph showing a relationship between actual stress-strain as a simulation result of the matrix model and the interface model.

In this preferred embodiment, it is to be noted that the interface model 5 has a viscoelastic property different from the matrix model 6. Here, the viscoelastic property includes the characteristic expressed with the stress-strain curve at arbitrary deformation rates, as shown in FIG. 10. For instance, the interface model 5 of the present embodiment has a viscoelastic property softer than the matrix model 6 such that the inclination to the horizontal axis of the stress-strain curve of interface model 5 can be set up smaller than that of matrix model 6 as shown in FIG. 10. The area of a hysteresis loop of each stress-strain curve is also changeable. In this case of the same stress, in this embodiment, the viscoelasticity characteristic is set that the stress of interface model 5 becomes larger than matrix model 6. However, it is not limited to such the embodiment.

Figure 11:
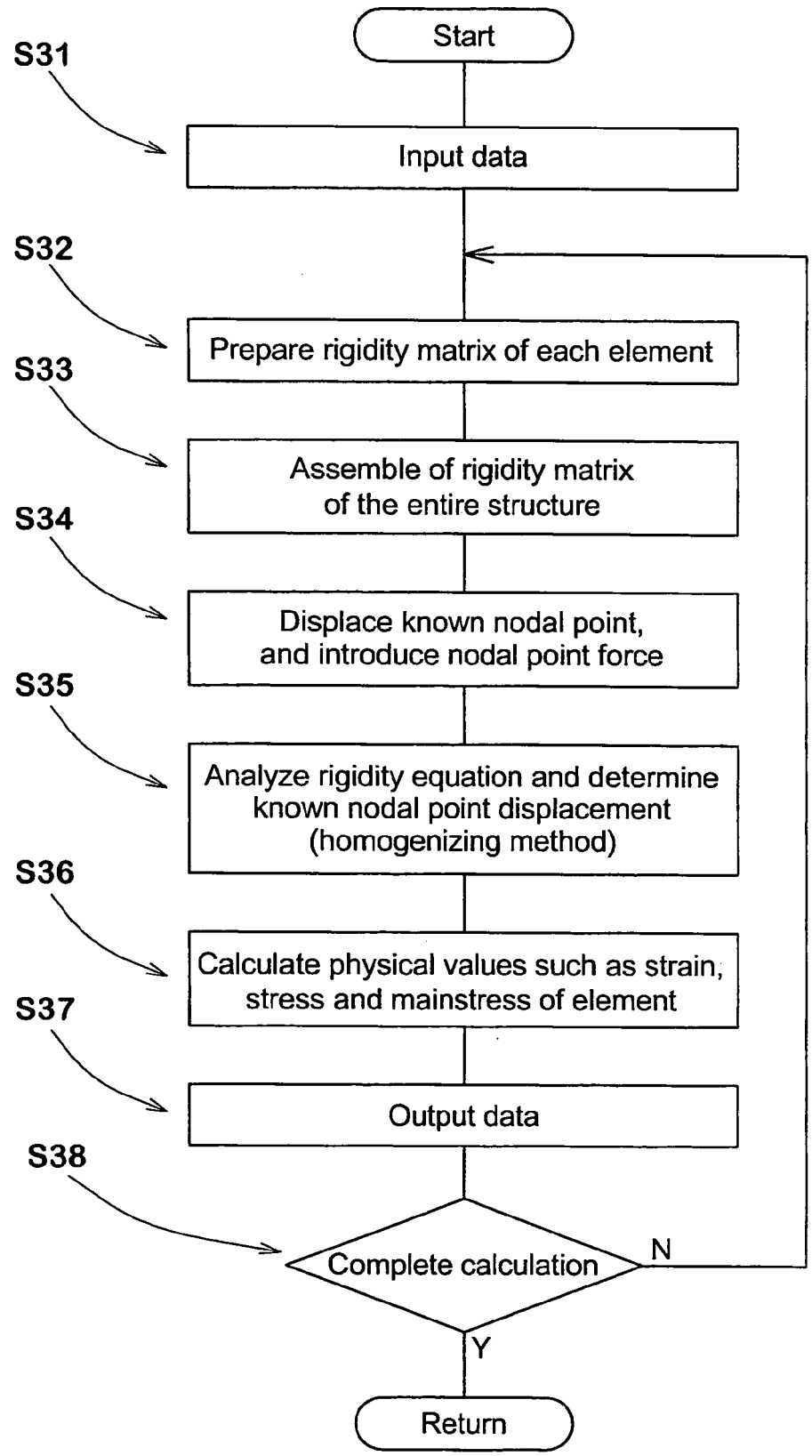
FIG. 11 is a flowchart showing procedures of deformation simulation.

Next, the deformation calculation (simulation) using the set rubber material model 2 is performed (step S3). In FIG. 11, one example of a specific procedure of the deformation calculation is shown. In the simulation, necessary data is first input to the computer apparatus 1 (step S31). The input data includes for example, numerical data for configuring the rubber material model 2, and a variety of pre-set boundary conditions.

A rigid matrix of each element is then formed (step S32) in the computer apparatus 1, and thereafter, the rigid matrix of the entire structure is assembled (step S33). A known node displacement and node force are adopted to the rigid matrix of the entire structure (step S34), and an analysis of the rigidity formula is carried out. The unknown node displacement is determined (step S35) and physical quantity such as strain, stress, and principal stress of each element are calculated and output (steps S36 and S37). In step S38, a determination is made whether or not to finish the calculation, and if the calculation is not to be finished, steps after step S32 is repeated.

The deformation calculation may be carried out using an engineering system analyzing application software (e.g., LS-DYNA and the like, developed and improved in Livermore software Technology corporation (US)) using the finite element method.

Figure 12:
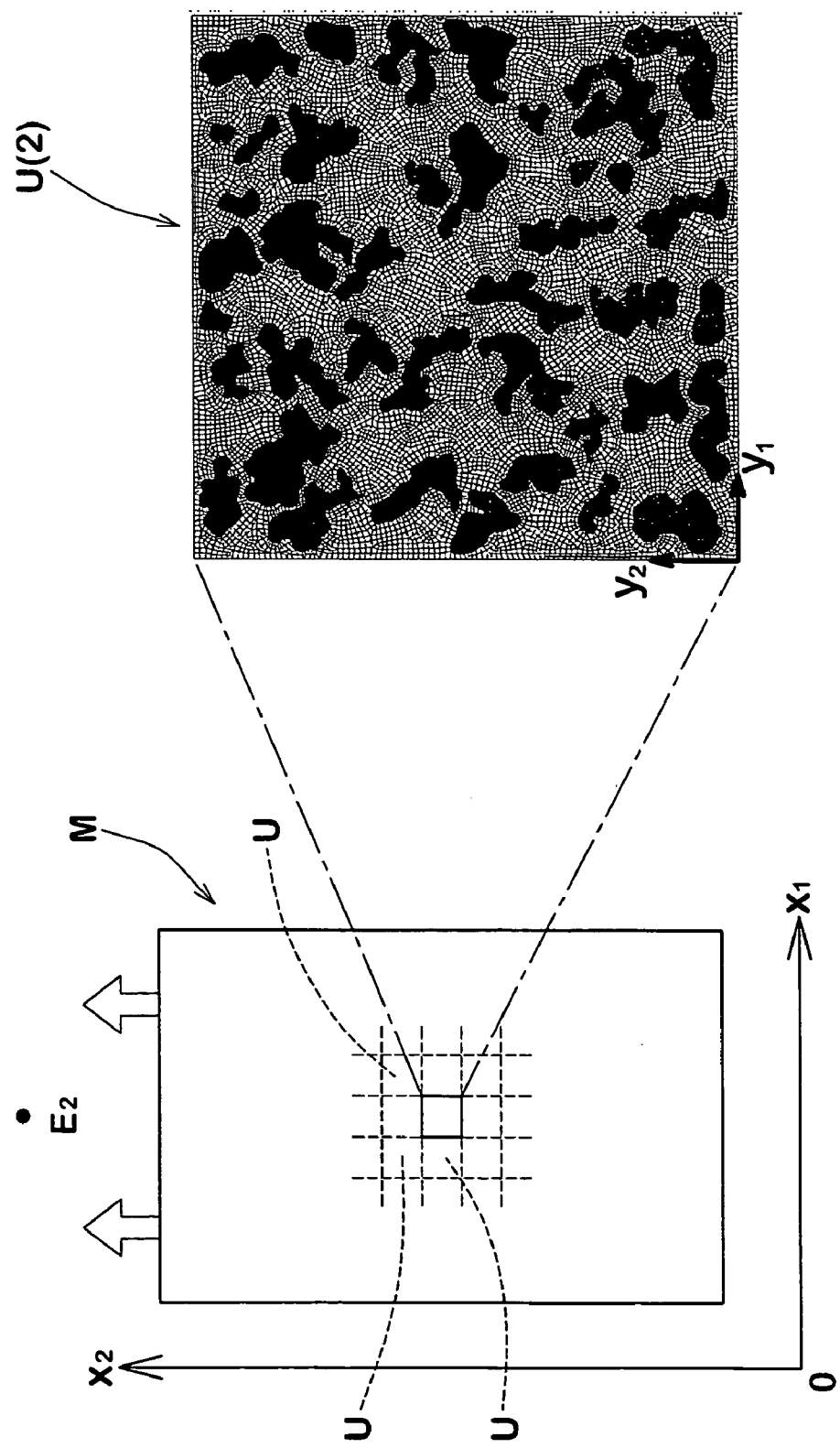
FIG. 12 is a view showing a relationship of the microscopic structure and an entire structure explaining a homogenizing method.

In this embodiment, in order to simulate the deformation of the rubber material, a rubber entire model M is set as shown in FIG. 12 for a homogenizing method. The entire model M comprises a great number of the unit cells U of the microscopic structure arranged periodically, and has a size which suits the computer simulation. When an area for simulation is constituted by the repetition of the microscopic structure, it is difficult to divide directly by using only the finite element method. Therefore, the homogenizing method is used. The method comprises a first stage of simulating the whole by using the entire model M equivalent to the area for analysis, and a second stage of converting the result to the microscopic structure (unit cell) at arbitrary points in the area for analysis.

Further, in the homogenizing method, two independent variables of macroscopic scales $x_1$ and $x_2$ representing an entire model M and the microscopic scales $y_1$ and $y_2$ representing the unit cell U of the rubber material model 2 are used as shown in FIG. 12. In the homogenizing method, the respective independent variable in different scales of the microscopic scales $y_1$, $y_2$ and the macroscopic scales $x_1$, $x_2$ are asymptotically developed. Thus, an average dynamic response of the entire model M of a certain size periodically including the unit cells U can be obtained. The asymptotically developing homogenizing method is a method already established in the numerical calculation method. The method is described in detail in for example, the following article.

Higa, Y. and Tomita, Y., computational Prediction of Mechanical properties of Nickel-based superalloy with gamma Prime Phase Precipitates, Proceedings of ICM8 (Victoria, B.C., Canada), Advance Materials and Modeling of Mechanical Behavior, (Edited by Ellyin, F., and Prove, J. W.), III (1999), 1061-1066, Fleming Printing Ltd.

In the present embodiment, the constants and the like of equations (1) and (10) are set as the following:

$C_R$=0.268
N=6.6
T=296
$k_B$=1.38066×10$^{-29}$
$N_A$=4.328×10$^{26}$
volume content of filler model: 30%
Modulus of longitudinal elasticity E of filler model: 100 MPa
Poisson's ratio ν of filler model: 0.3.

In the deformation simulation, uniform uniaxial tensile deformation was generated in an analysis region of the entire model M. Two tension conditions, i.e., a high speed deformation condition in which strain rate is equal to 1 (/s) in $x_2$ direction in FIG. 12, and a low speed deformation condition in which strain rate is equal to 0.01 (/s) were used. In any of the cases, the strain was set to 0.15 and then, load was eliminated and the material was deformed at each of the speeds.

In the deformation calculation, the average segment number N is calculated for each strain state, as mentioned above, and such value is substituted to equation (1) and the calculation is sequentially carried out. The three-dimensional eight chain rubber elasticity model of Aruuda et al. is used in the rubber material model 2 (the entire model M) without changing in the direction of thickness (direction of Z axis in FIG. 3). Further, the average segment number N of the matrix model 3 and the interface model 5 is set as the following:

interface model:

average segment number N during loaded deformation $$N=-5.9286+20.6175\lambda_c-21.8168\lambda_c^2+10.8227\lambda_c^3-1.9003\lambda_c^4$$

total number $N_A$ (constant) of segment of molecular chain $$N_A=3.203\times10^{25}$$

matrix model:

average segment number N during loaded deformation $$N=-3.2368+20.6175\lambda_c-21.8168\lambda_c^2+10.8227\lambda_c-1.9003\lambda_c^4$$

total number $N_A$ (constant) of segment of molecular chain $$N_A=4.3281\times10^{26}$$

Figure 13:
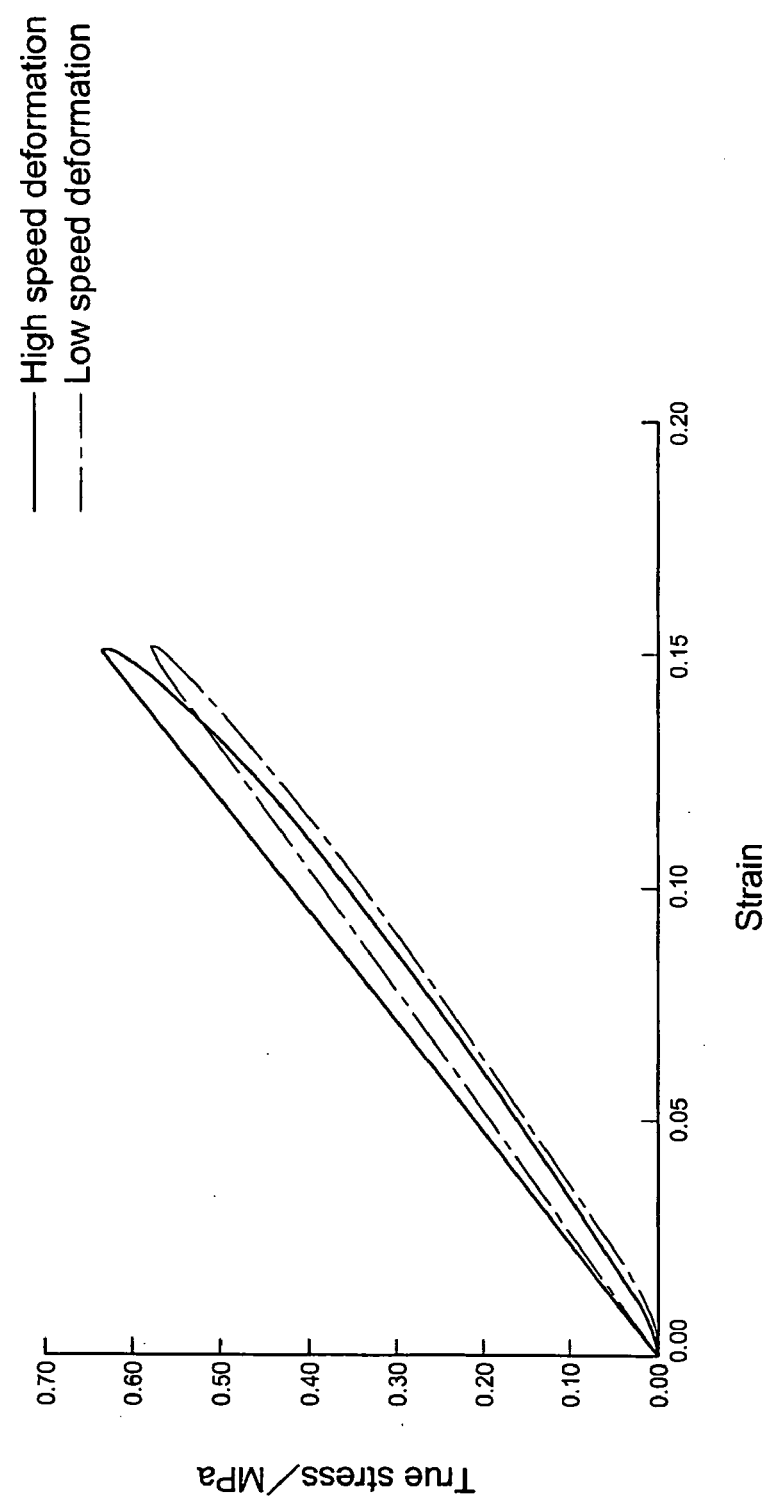
FIG. 13 is a graph showing a relationship between true stress and strain as a simulation result of the rubber material model (entire structure)

If the deformation calculation is carried out, it is possible to obtain necessary data such as physical amount for every timing of each calculating step from a result of the deformation calculation (step S4). FIG. 13 is a graph showing a relationship between true stress and strain of the rubber material model formed using the calculation result. As apparent from the drawing, the rubber material model 2 shows different viscoelasticity characteristics depending upon the strain rate. As a result of this simulation, hardening phenomenon of material appears in the high speed deformation as compared with the low speed deformation (dashed line) as in the case of actual rubber materials. In the case of the high speed deformation, it was confirmed that the energy loss is greater as compared with the low speed deformation.

Figure 14:
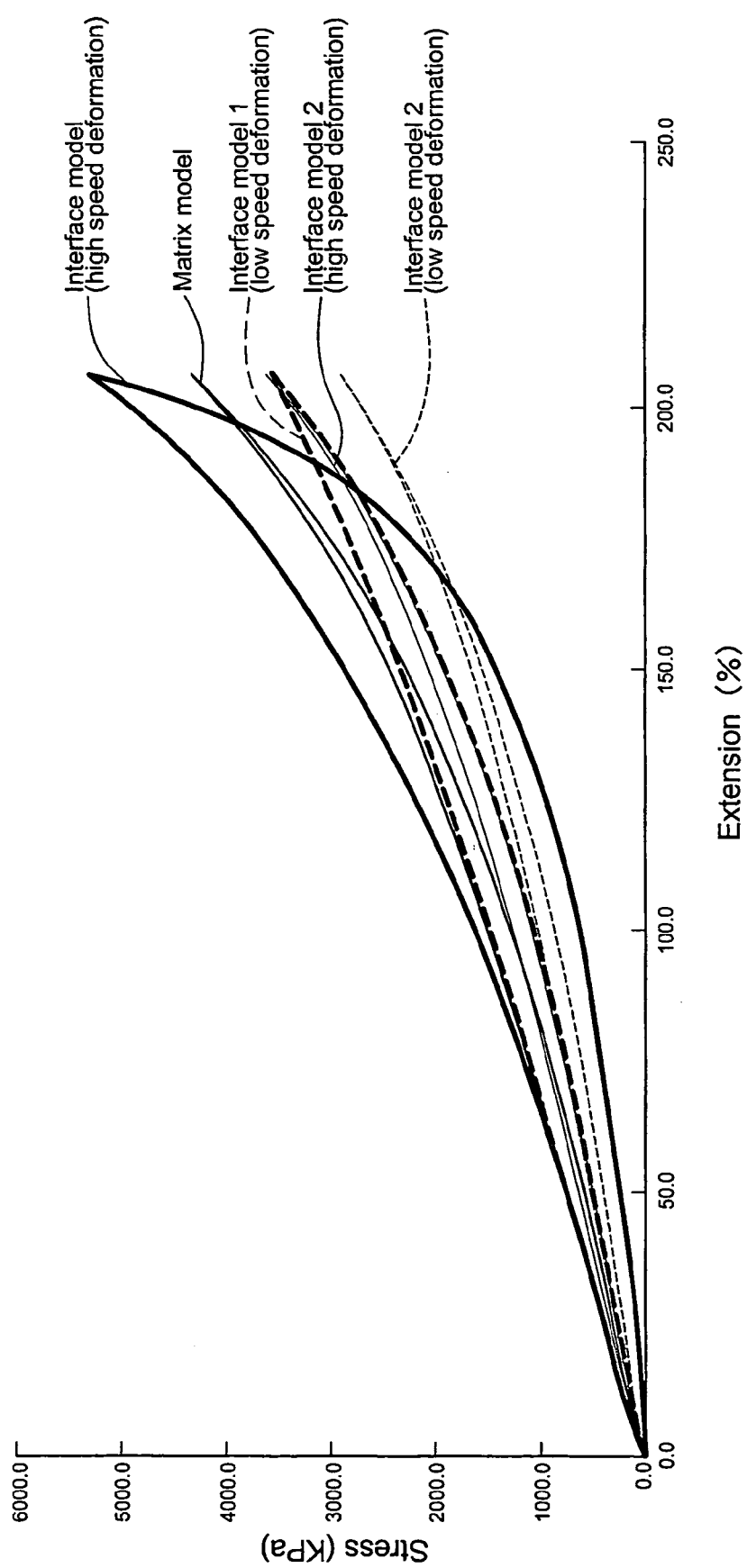
FIG. 14 is a graph showing relationships between true stress and strain showing results of simulation of each model.

FIG. 14 shows another result of the present embodiment. In this embodiment, the strain rate dependence is defined only in the interface model, and is not defined in the matrix model. Representative examples of the filler are carbon black and silica. The biggest difference therebetween is not the filler itself but is an interface between the filler surface and the rubber. It is considered that the rubber in the vicinity of the interface exerts sensitive influence on the material characteristics, and dependency on the strain rate is high. Therefore, it is effective to change the strain-rate dependence of the interface model and the matrix model to obtain an important idea as to how the filler and the polymer should be coupled to each other.

In each interface model, strain rate dependence as shown in FIG. 14 is defined. In this example, an interface model 1 having carbon black has great strain rate dependence and energy loss is also set great. An interface model 2 having silica has small strain rate dependence and energy loss is also set small. In the drawing, the high speed deformation has the strain rate of 1,000 (/s) and the low speed deformation has the strain rate of 0.1 (/s).

Figure 15:
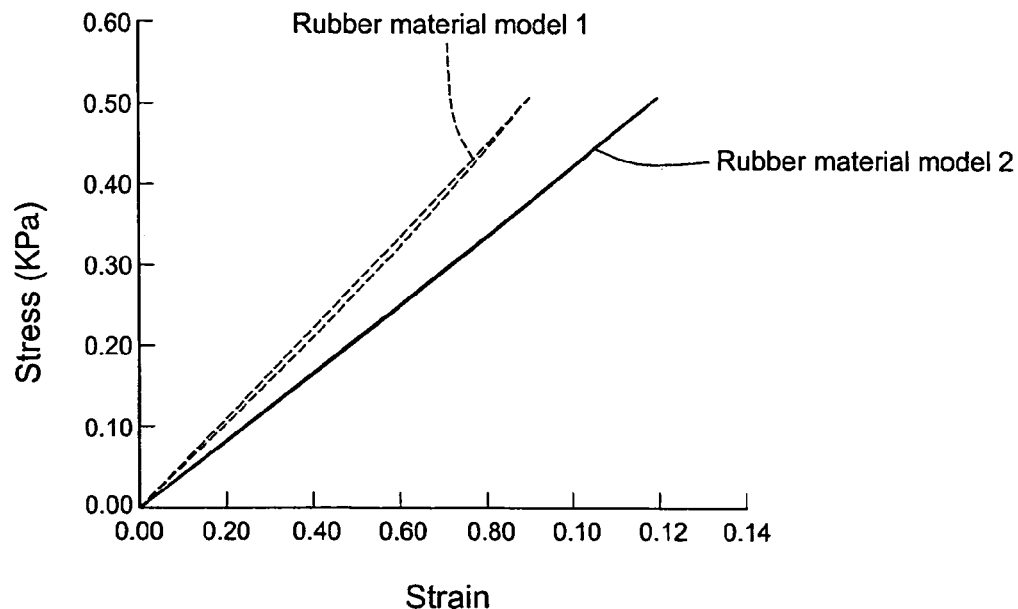
FIG. 15 is a graph showing the relationship between true stress and strain showing the result of simulation of rubber material model.

Two kinds of rubber material models, i.e., the interface models 1 and 2 were used, and the simulation was carried out with high speed deformation. FIG. 15 shows a result of the simulation. A vertical axis shows strain and a lateral axis shows true stress. From this result, it can be found that although only rate dependence of the interface model having small thickness is changed, a large difference is generated in the viscoelasticity characteristics of the rubber material.

Figure 16:
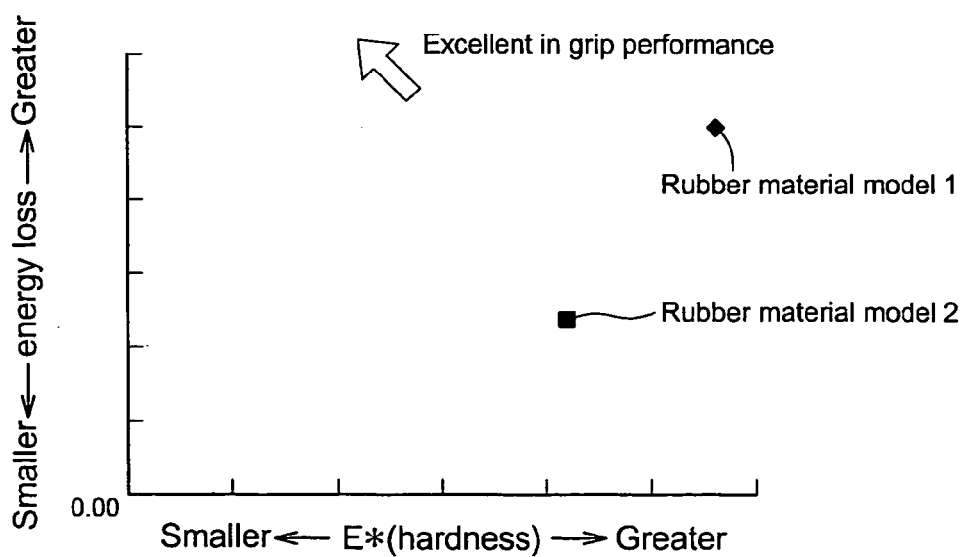
FIG. 16 is a graph showing the relationship between energy loss and hardness of the rubber material models.

FIG. 16 is a graph in which a lateral axis shows elasticity modulus (inclination with respect to the lateral axis of the graph shown in FIG. 15), and a vertical axis shows energy loss (hysteresis loop). Concerning the grip performance of the previous tire, viscoelasticity characteristics extending in a left and upward direction of the graph is preferable.

Figure 17:
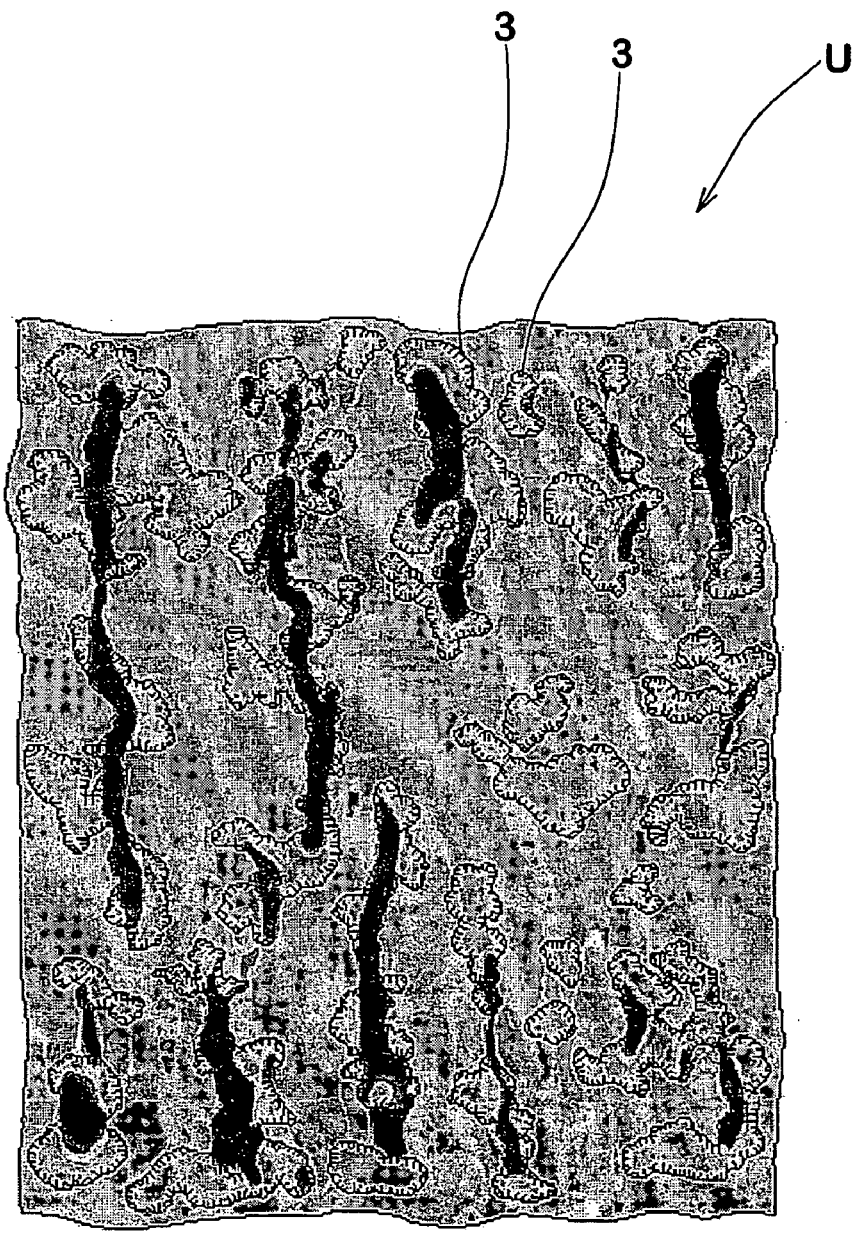
FIG. 17 is a distribution chart of stress of the rubber material model.

The simulation of this embodiment includes a step for forming and displaying a distribution chart from obtained data (step S5). FIG. 17 shows one example of the distribution chart of stress generated in each element of the unit cell U (this unit cell U is one shown in FIG. 12 not in FIG. 3) in the maximum strain state at the time of the high speed deformation. Further, variation of the outline shape of the unit cell U is also visualized. The step for forming the distribution diagram is carried out by replacing a stress value obtained for each element by information which can visually be identified such as color information (color saturation, hue, brightness and the like). In FIG. 17, greater strain has denser color saturation. From this result, it can be found that greater stress is concentrated on a portion where a distance between filler models 3 and 3 is smaller. It can also be found that a portion having higher stress is connected in a form of a line along a tensile direction through the filler model 3.

Figure 18:
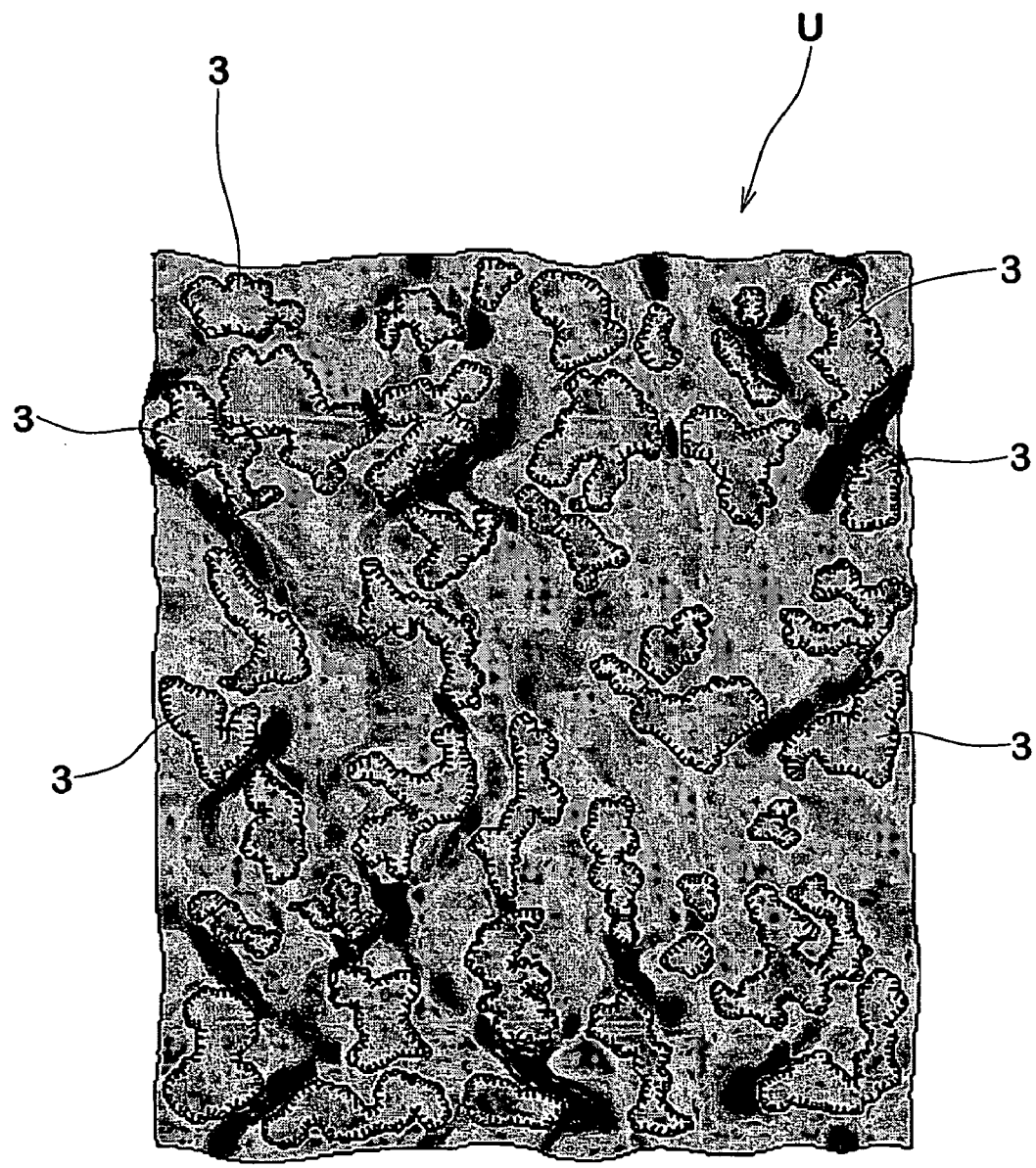
FIG. 18 is a distribution chart of energy loss of the rubber material model.

FIG. 18 is a distribution chart of energy loss generated in each element of the unit cell U at the time of high speed deformation. To obtain the energy loss, load was removed at the same speed as that of each strain rate, and a stress strain curve of one cycle was obtained. The outline shape of the unit cell U shown in FIG. 17 was employed. In this distribution chart also, the energy loss obtained for each element was replaced by the color information (color saturation, hue, brightness and the like). Greater strain has denser color saturation. From this result also, it can be found that greater stress is generated on a portion where a distance between filler models 3 and 3 is smaller. The filler model 3 is colored but generates no energy loss. In addition, the data such as physical value used in the distribution chart is not limited to stress value or energy loss, and various values are employed in accordance with purpose of analysis.

Figure 19:
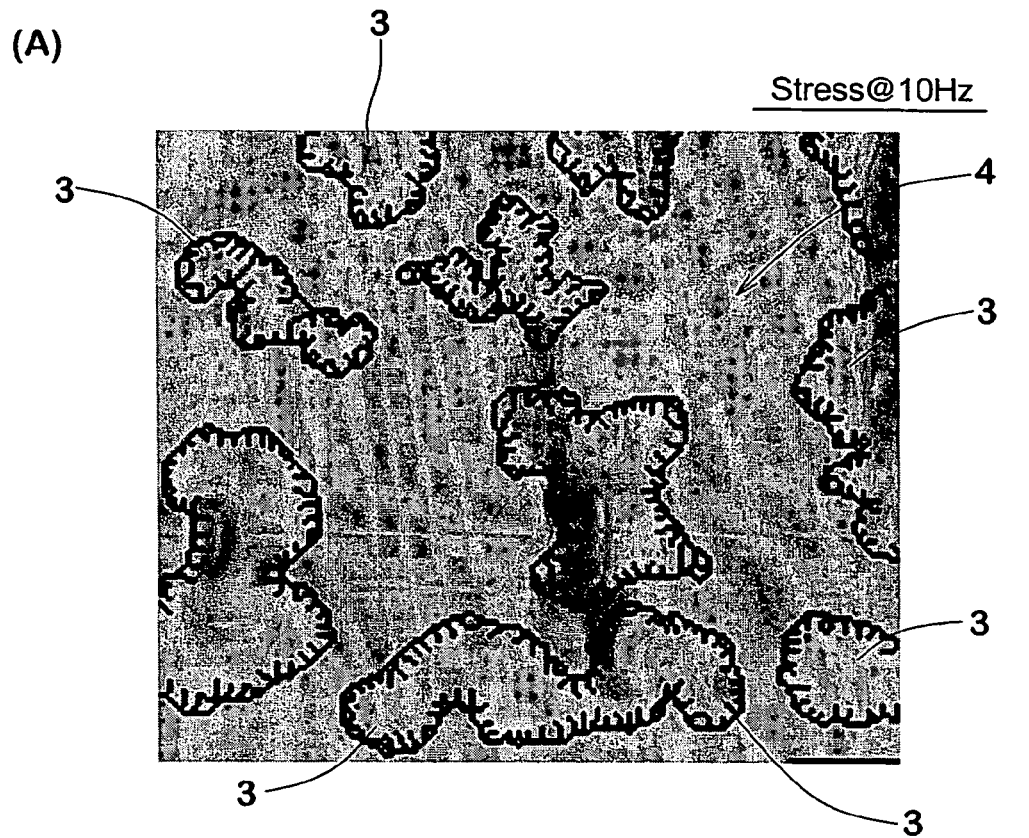
FIG. 19 are distribution charts of stress, wherein (A) is of the low speed deformation and (B) is of the high speed deformation.
Figure 19:
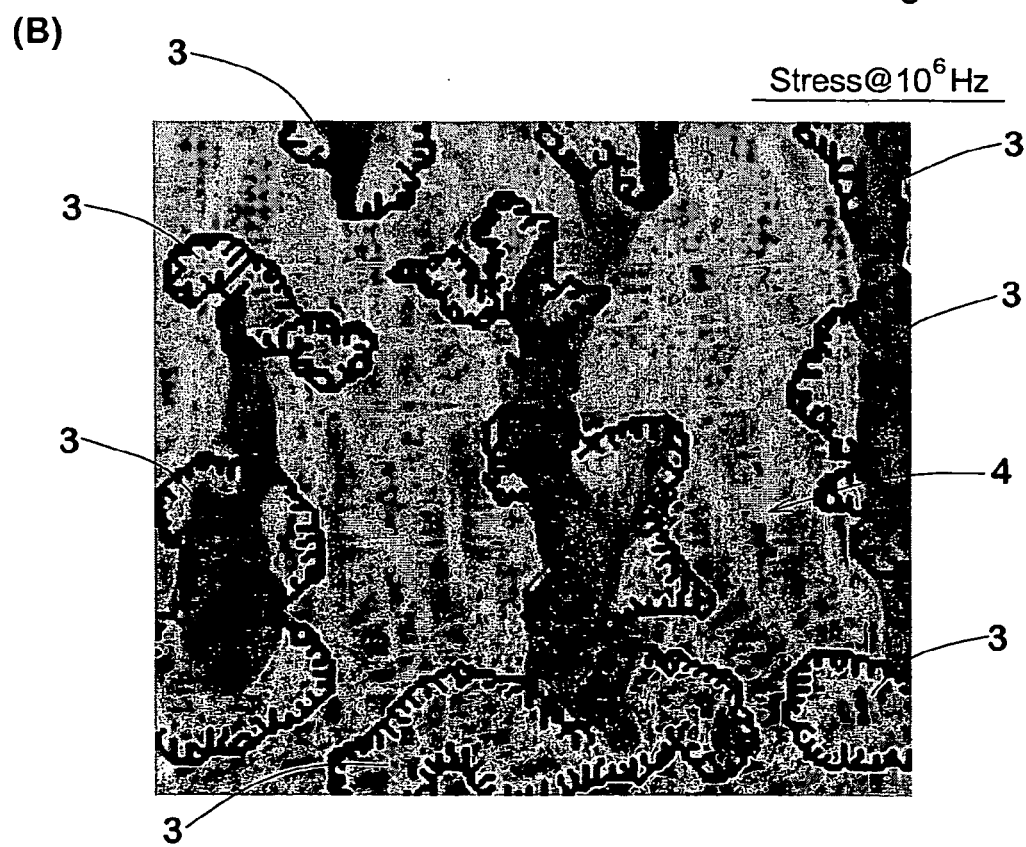

FIGS. 19(A) and 19(B) are partial enlarged views of stress distributions of the unit cell U in the maximum strain state at the time of high speed deformation and low speed deformation, respectively, and show a state in which the stress distribution is varied depending upon difference of deformation frequency although the strain is the same. That is, in the case of the high speed deformation, high stress is generated in relatively wide range, and this phenomenon appears clearly especially between the filler models 3 and 3.

When a filler and rubber are collectively modeled as one as shown in the article (2), the stress distribution of the unit cell is uniform, and the model is physically deformed merely into a rectangular shape. Therefore, such a distribution diagram is obtained only after a rubber and a filler to be filled into rubber are separated and modeled.

The distribution chart provides extremely useful information useful for developing the actual rubber material. In a filler to be filled into rubber for example, one from which uniform stress distribution can be obtained at the time of deformation is preferable. To develop such a filler to be filled into rubber material, it is important to first know the current stress distribution state. From its result, it is possible to try to improve the distribution properties and its physical shape of the filler to reduce the variation of distance between the fillers as small as possible. Using the improved filler model, a unit cell is again formed, and the deformation simulation can be carried out repeatedly on a computer until preferable uniform stress distribution is obtained.

When more uniform stress distribution is obtained by the calculation, it is preferable that the physical structure of the unit cell, i.e., filler's particle shape, distribution degree and the like of the filler are reflected to the actual produce. Especially the distribution state of the filler can be controlled by three parameters, i.e., a mixing amount of filler into rubber, mixing time and mixing temperature. Therefore, if the distribution properties of the ideal filler model 3 can be obtained, it is possible to develop a tire rubber composition having excellent grip force or rubber material having excellent fuel efficiency for relatively short time.

The simulation method of the present invention is effectively used for developing tread rubber of a pneumatic tire, for example. As described above, it is preferable that the fuel efficiency of the tread rubber is more excellent if complex elasticity modulus at the time of low speed deformation of rubber is greater and the energy loss is smaller. Here, an index X1 of fuel efficiency of tread rubber can be expressed as in the following equation (16), and a rubber having greater index X1 is preferable:

$$X1 = K1 \cdot \tan \delta_L + K2 \cdot E_L^{*-1} \quad (16),$$

wherein K1 and K2 represent constants, $\tan \delta_L$ represents loss tangent of filler to be filled into rubber in a specific frequency in a range of 10 to 100 Hz, and $E_L^*$ represents a complex elasticity modulus of filler to be filled into rubber at a specific frequency in a range of deformation frequency 10 to 100 Hz.

On the other hand, the grip performance of a tread rubber is more excellent when the energy loss at the time of high speed deformation of rubber is greater. Here, an index X2 of grip performance of tread rubber can be expressed in the following equation (17), and a rubber having greater index X2 is preferable:

$$X2 = K3 \cdot \tan \delta_H \quad (17),$$

wherein, K3 represents a constant, and $\tan \delta_H$ represents a loss tangent of filler to be filled into rubber at a specific frequency in a range of deformation frequency $10^4$ to $10^6$ HZ.

Figure 20:
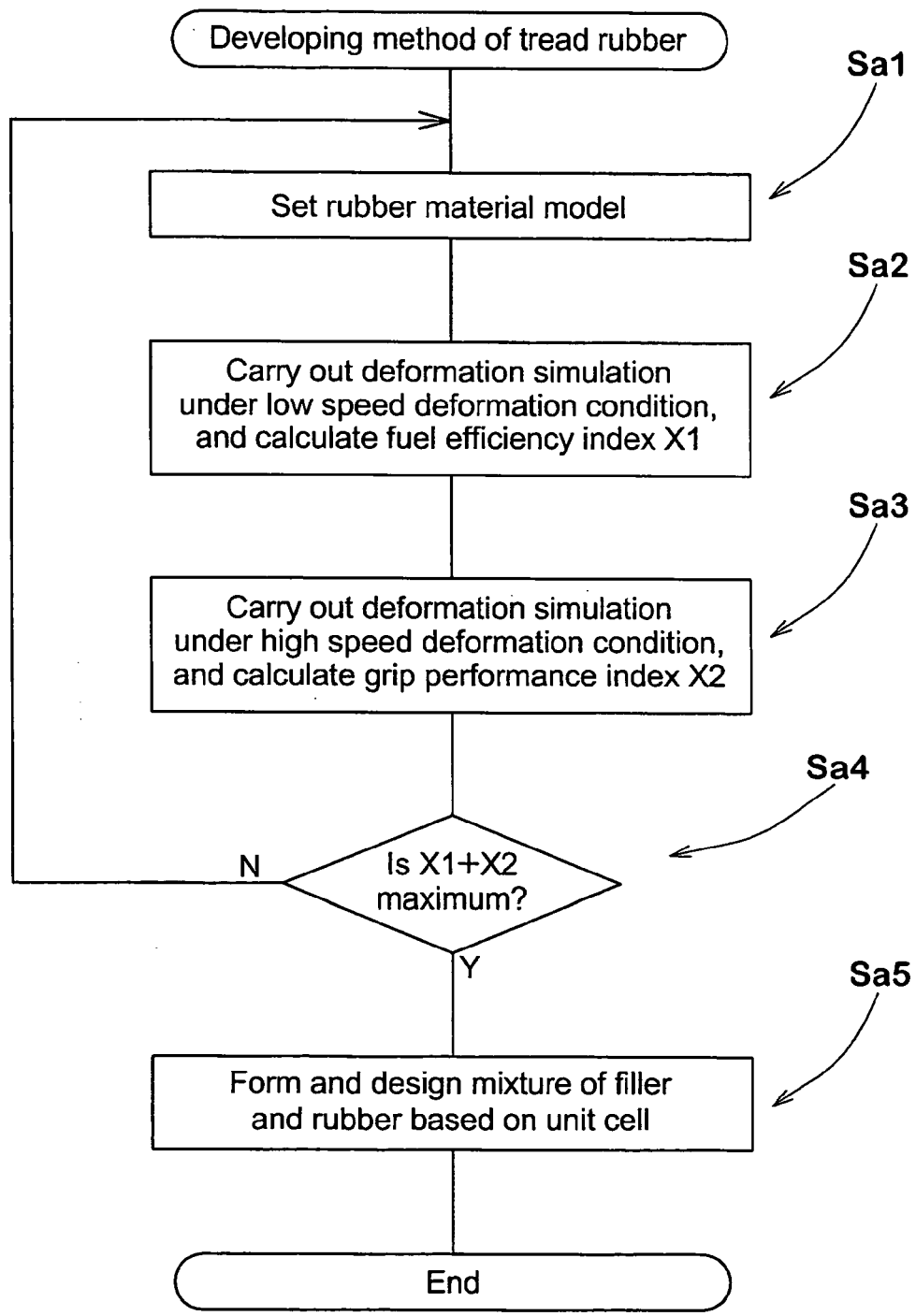
FIG. 20 is a flowchart showing a developing procedure of a tread rubber.
Figure 21:
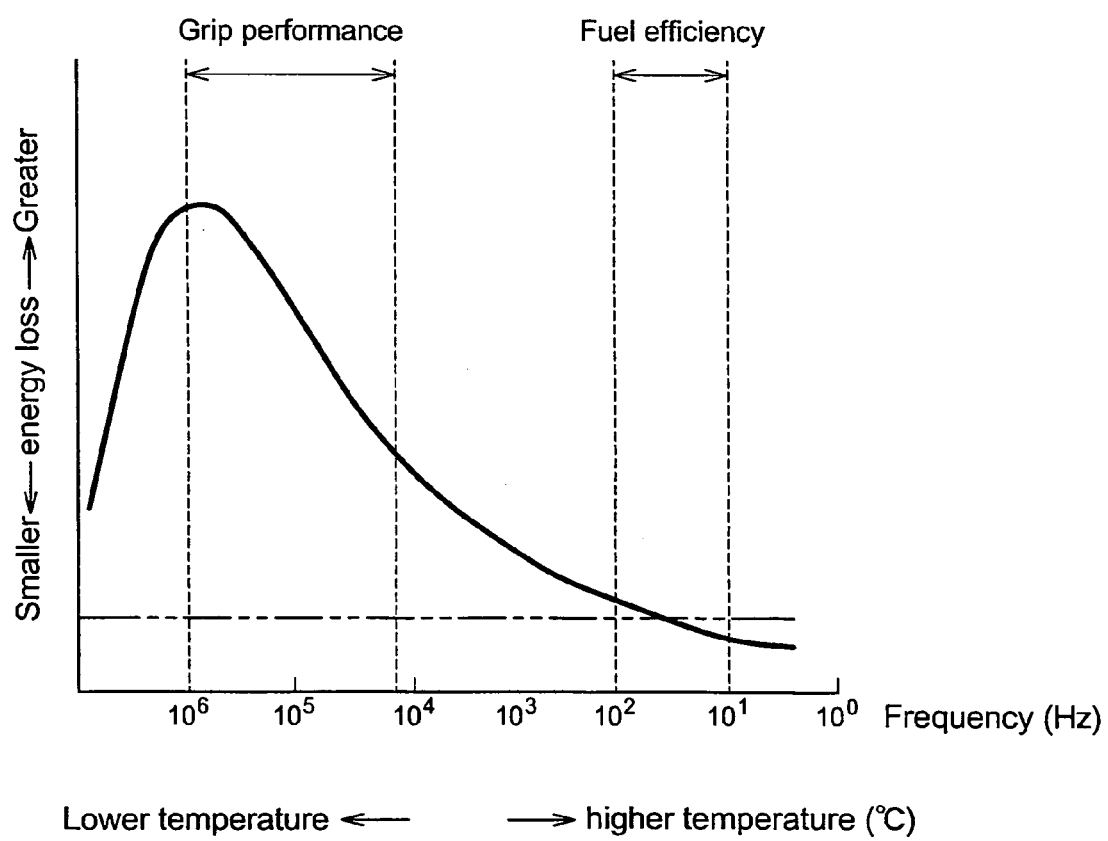
FIG. 21 is a graph showing a relationship between energy loss and strain rate of rubber material obtained by frequency-temperature conversion rule.

FIG. 20 is a flowchart showing one example of a developing method of tread rubber utilizing the simulation method of the present invention. In this embodiment, a rubber material model 2 is first set (step Sa1) and based on this, a deformation simulation under the low speed deformation is carried out. With this, the index X1 concerning the fuel efficiency is calculated (step Sa2). Based on the same rubber material model 2, the deformation simulation is carried out under the high speed deformation condition. With this, the index X2 concerning the grip performance is calculated (step Sa3). The steps Sa2 and Sa3 may be carried out in parallel or in the reversed order.

To satisfy both the fuel efficiency and grip performance, it is preferable that a sum of the indices X1 and X2 is greater. Thus, in this embodiment, it is determined whether the sum of the indices X1 an X2 becomes maximum (step Sa4). If true in the step Sa4, the actual filler and rubber mixture is prototyped and designed based on the set rubber material model 2 (unit cell U). If false in the step Sa4, the parameter of the unit cell U is changed, and the rubber material model 2 is again set (step Sa1). Then, the deformation simulation is repeatedly carried out in the same manner until the sum (X1+X2) of the indices becomes maximum.

Examples of parameters to be changed are an inclination of the stress-strain diagram (parameters such as CR and N in the equation (1)), the magnitude of the hysteresis loop (inclinations of $\lambda_c$ and N in FIG. 9), and the strain-rate dependence (material constant of the equation (11)). As described above, the simulation method of the present invention is of great use for developing concrete various rubber products.

The invention claimed is:

1. A method of simulating deformation of a rubber material having a filler part made of at least one filler particle and a rubber part surrounding the filler part, comprising the steps of:
    dividing the rubber material into a finite number of elements to form a rubber material model; the step of dividing including the steps of
        dividing the filler part into a finite number of elements to form a filler model;
        dividing the rubber part into a finite number of elements to form a rubber model disposed around the filler model, said rubber model having strain-rate dependence such that the viscoelastic property varies with strain rate thereof, and wherein the rubber model comprises
            an interface model having a thickness in a range of from 1 to 20 mm and contacting around the filler model and
            a matrix model disposed outside of the interface model, said interface model having a viscoelastic property softer than that of the matrix model;
    performing deformation calculation of the rubber material model based on predetermined condition;

acquiring data relating to a distribution of physical values of the rubber model from the deformation calculation; and providing a display of the data.

2. The method of simulating deformation of the rubber material according to claim 1, wherein the method further comprises the step of displaying at least one of the data as a chart.

3. The method of simulating deformation of the rubber material according to claim 1, wherein said data includes stress and/or energy loss of each element of the rubber model.

4. The method of simulating deformation of the rubber material according to claim 1, wherein
the strain-rate dependence is defined only in the interface model.

5. The method of simulating deformation of the rubber material according to claim 1, wherein the thickness of the interface model is set in a range of from 5 to 10 nm.

6. The method of simulating deformation of the rubber material according to claim 1, wherein
the step of performing deformation calculation includes the steps of
carrying out a first deformation simulation of the rubber material model under a low deformation frequency of from 10 to 100 Hz;
calculating an index X1 indicative of a low speed deformation of the rubber material model by using a result of the first deformation simulation;
carrying out a second deformation simulation of the rubber material model under a high deformation frequency of from $10^4$ to $10^6$ Hz;
calculating an index X2 indicative of a high speed deformation of the rubber material model by using a result of the second deformation simulation;
calculating a sum of indices X1 and X2; and
repeating the first deformation simulation and the second deformation simulation while changing at least one parameter of the rubber material model until the sum of indices X1 and X2 becomes maximum.

7. The method of simulating deformation of the rubber material according to claim 6, wherein
the indices X1 and X2 are calculated as follows:

$X1 = K1 \cdot \tan \delta_L + K2 \cdot E_L*^{-1}$ and $X2 = K3 \cdot \tan \delta_H \ldots$ (17), wherein "K1" "K2" and "K3" represent constants, "$\tan \delta_L$" represents loss tangent of the filler part at a frequency of from 10 to 100 Hz, "$E_L*$" represents a complex elasticity modulus of the filler part at a deformation frequency of 10 to 100 Hz and "$\tan \delta_H$" represents a loss tangent of the filler part at a deformation frequency of front $10^4$ to $10^6$ Hz.

* * * * *

UNITED STATES PATENT AND TRADEMARK OFFICE
CERTIFICATE OF CORRECTION

PATENT NO.       : 7,292,966 B2
APPLICATION NO.  : 11/227518
DATED            : November 6, 2007
INVENTOR(S)      : Masato Naito It is certified that error appears in the above-identified patent and that said Letters Patent is hereby corrected as shown below:

In Claim 1, Column 14, Line 61, please correct "from 1 to 20 mm (millimeter)"; to read as --from 1 to 20 nm (nanometer).--

Signed and Sealed this

Thirteenth Day of May, 2008

JON W. DUDAS
*Director of the United States Patent and Trademark Office*